US012792306B2

(12) United States Patent
Zhang et al.

(10) Patent No.: US 12,792,306 B2
(45) Date of Patent: Nov. 10, 2026

(54) COMPUTING APPARATUS AND METHOD FOR NEURAL NETWORK OPERATIONS INCLUDING FLOATING-POINT NUMBER OPERATIONS

(71) Applicant: Anhui Cambricon Information Technology Co., Ltd., Hefei (CN)

(72) Inventors: Yao Zhang, Hefei (CN); Shaoli Liu, Hefei (CN)

(73) Assignee: ANHUI CAMBRICON INFORMATION TECHNOLOGY CO., LTD., Hefei (CN)

( * ) Notice: Subject to any disclaimer, the term of this patent is extended or adjusted under 35 U.S.C. 154(b) by 1235 days.

(21) Appl. No.: 17/620,547

(22) PCT Filed: Oct. 22, 2020

(86) PCT No.: PCT/CN2020/122949

§ 371 (c)(1),
(2) Date: Jun. 26, 2022

(87) PCT Pub. No.: WO2021/078210

PCT Pub. Date: Apr. 29, 2021

(65) Prior Publication Data

US 2022/0350569 A1 Nov. 3, 2022

(30) Foreign Application Priority Data

Oct. 25, 2019 (CN) ........................ 201911023669.1

(51) Int. Cl.

| | |
|---|---|
| ***G06F 7/53*** | (2006.01) |
| ***G06F 7/485*** | (2006.01) |
| ***G06F 7/487*** | (2006.01) |
| ***H03K 19/21*** | (2006.01) |

(52) U.S. Cl.
CPC ............ *G06F 7/5318* (2013.01); *G06F 7/485* (2013.01); *G06F 7/4876* (2013.01); *H03K 19/21* (2013.01)

(58) Field of Classification Search
CPC ...... G06F 7/5318; G06F 7/485; G06F 7/4876; G06F 7/483; G06F 7/53; G06F 7/523; G06F 7/5443; G06F 7/57; G06N 3/063
See application file for complete search history.

(56) References Cited

U.S. PATENT DOCUMENTS 10,831,445 B1 * 11/2020 Clark .................... G06F 7/5235
2011/0219052 A1 * 9/2011 Langhammer ........ G06F 17/141 708/405

(Continued)

FOREIGN PATENT DOCUMENTS

CN 107844826 A 3/2018
CN 110210615 A 9/2019

OTHER PUBLICATIONS

CN201911023669.1—First Office Action mailed on Jul. 20, 2023, 8 pages. (With Brief English Explanation).

(Continued)

*Primary Examiner* — James Trujillo
*Assistant Examiner* — Jakob Oscar Gudas
(74) *Attorney, Agent, or Firm* — Getech Law LLC; Jun Ye

(57) ABSTRACT

The present disclosure relates to a computing apparatus, a method, an integrated circuit chip and an integrated circuit device for performing a neural network operation. The computing apparatus may be included in a combined processing apparatus. The combined processing apparatus may further include a general interconnection interface and other processing apparatus. The computing apparatus interacts with other processing apparatus to jointly complete calculation operations specified by users. The combined process- (Continued)

ing apparatus may further include a storage apparatus. The storage apparatus is respectively connected to the computing apparatus and other processing apparatus, and the storage apparatus is used for storing data of the computing apparatus and other processing apparatus. Solutions of the present disclosure may be widely applied to various floating-point data computations.

17 Claims, 13 Drawing Sheets

(56) References Cited

U.S. PATENT DOCUMENTS

| | | | | |
|---|---|---|---|---|
| 2016/0062673 | A1* | 3/2016 | Tiwari | G11C 7/1006 711/154 |
| 2018/0321938 | A1* | 11/2018 | Boswell | G06F 9/3001 |
| 2019/0018673 | A1* | 1/2019 | Langhammer | G06F 7/509 |
| 2019/0378001 | A1* | 12/2019 | Litvak | G06F 9/5044 |

OTHER PUBLICATIONS

PCT/CN2020/122949—International Search Report and Written Opinion mailed on Jan. 19, 2021, 17 pages.

Yuquan, Yang, "Design of High-performance Floating-point DSP Coprocessor", Information Science and Technology, China Master's Theses Full-Text Database, No. 2, Chapter 2-3, Feb. 15, 2019, 79 pages (With brief English Translation).

* cited by examiner

COMPUTING APPARATUS AND METHOD FOR NEURAL NETWORK OPERATIONS INCLUDING FLOATING-POINT NUMBER OPERATIONS

CROSS REFERENCE OF RELATED APPLICATION

This is a 371 of International Application No. PCT/CN2020/122949, filed Oct. 22, 2020, which claims priority to: Chinese Patent Application No. 201911023669.1 with the title of "Computing Apparatus and Method for Neural Network Operation, Integrated Circuit, and Device" filed on Oct. 25, 2019. The content of the aforementioned applications are herein incorporated by reference in their entirety.

TECHNICAL FIELD

The present disclosure generally relates to the technical field of data processing. More specifically, the present disclosure relates to a computing apparatus, a method, an integrated circuit chip and an integrated circuit device for a neural network operation.

BACKGROUND

A current neural network involves computation operations of weight data (such as convolution data) and neuron data, where a large number of multiplication and addition operations are included. Efficiency of the multiplication and addition operations often depends on execution speed of a multiplier used. Although a current multiplier has achieved a significant improvement in execution efficiency, there is still room for improvement in processing floating-point-type data. Additionally, during a neural network operation, processing operations of the aforementioned weight data and the aforementioned neuron data are involved. However, at present, there lacks a good computation mechanism for processing these pieces of data, resulting in low efficiency of the neural network operation.

SUMMARY

In order to at least partially solve the technical problem that has been mentioned in BACKGROUND, a solution of the present disclosure provides a computing apparatus, a method, an integrated circuit chip and an integrated circuit device for performing a neural network operation, thereby efficiently performing the neural network operation and realizing a high-efficiency reuse of weight data and neuron data.

A first aspect of the present disclosure provides a computing apparatus for performing a neural network operation. The computing apparatus includes: an input terminal configured to receive at least one piece of weight data and at least one piece of neuron data of a to-be-performed neural network operation; a multiplication unit, including at least one floating-point multiplier, where the floating-point multiplier is configured to perform a multiplication operation of the neural network operation on the at least one piece of weight data and the at least one piece of neuron data to obtain corresponding product results; an addition unit configured to perform an addition operation on the product results to obtain a plurality of intermediate results; and an update unit configured to perform multiple summation operations on the plurality of intermediate results that are generated to output a final result of the neural network operation.

A second aspect of the present disclosure provides a method for performing a neural network operation. The method includes: receiving at least one piece of weight data and at least one piece of neuron data of a to-be-performed neural network operation; performing, by a multiplication unit including at least one floating-point multiplier, a multiplication operation of the neural network operation on the at least one piece of weight data and the at least one piece of neuron data to obtain corresponding product results; performing, by an addition unit, an addition operation on the product results to obtain a plurality of intermediate results; and performing, by an update unit, multiple summation operations on the plurality of intermediate results that are generated to output a final result of the neural network operation.

A third aspect of the present disclosure provides an integrated circuit chip and an integrated circuit device. The integrated circuit chip includes the aforementioned computing apparatus for performing a neural network operation, and the integrated circuit device includes the integrated circuit chip.

By using the computing apparatus including the multiplication unit, the method, the integrated circuit chip, and the integrated circuit device of the present disclosure, the neural network operation may be performed efficiently, especially a convolution operation in a neural network. Additionally, during the neural network operation, the present disclosure further supports a reuse of weight data and neuron data, thereby avoiding an excessive data migration and an excessive data storage, improving computation efficiency, and reducing computation costs.

BRIEF DESCRIPTION OF DRAWINGS

By reading the following detailed description with reference to drawings, the above and other objects, features and technical effects of exemplary implementations of the present disclosure will become easier to understand. In the drawings, several implementations of the present disclosure are shown in an exemplary but not restrictive manner, and the same or corresponding reference numerals indicate the same or corresponding parts.

DETAILED DESCRIPTION

Figure 1:
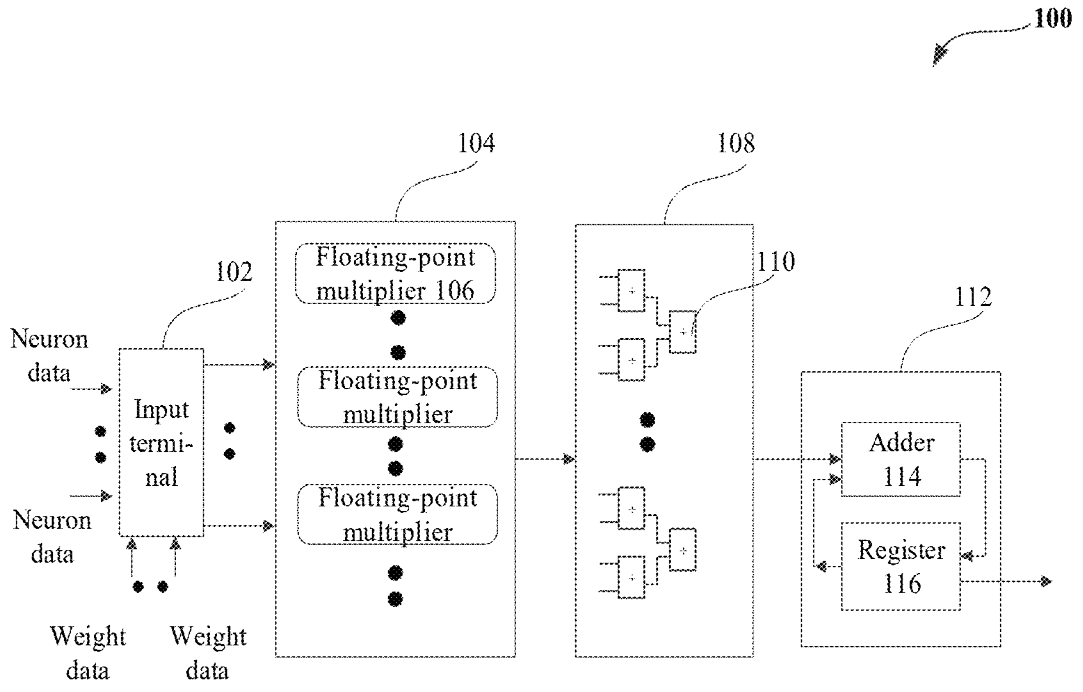
FIG. 1 is a schematic block diagram of a computing apparatus according to an embodiment of the present disclosure.

Embodiments will now be described with reference to drawings. It should be understood that for the sake of simplicity and clarity, in a suitable case, reference numerals may be repeated in the drawings to indicate corresponding or similar components. Additionally, the present disclosure describes many details to provide a thorough understanding of embodiments of the present disclosure. However, those of ordinary skill in the art may understand that the embodiments of the present disclosure may be practiced without these details. In other cases, the present disclosure does not detail well-known methods, processes and components, so as to avoid obscuring the embodiments of the present disclosure. Further, the description should also not be regarded as a limitation on the range of the embodiments of the present disclosure.

A technical solution of the present disclosure uses a multiplication unit including one or more floating-point multipliers to perform a multiplication operation between weight data and neuron data and perform an addition operation and an updating operation on product results that are obtained to obtain a final result. The solution of the present disclosure not only improves efficiency of the multiplication operation through the multiplication unit, but also stores a plurality of intermediate results before the final result through the updating operation, so as to realize a high-efficiency reuse of the weight data and the neuron data.

The following describes a plurality of embodiments of the present disclosure in detailed in combination with the drawings.

FIG. 1 is a schematic block diagram of a computing apparatus 100 according to an embodiment of the present disclosure. As mentioned earlier, the computing apparatus may be used to perform neural network operations, especially to process weight data and neuron data to obtain an expected computation result. In an embodiment, if a neural network is a convolution neural network for images, the weight data may be convolution kernel data, and the neuron data may be, for example, pixel data of an image or output data after a front layer computation operation.

As shown in FIG. 1, the computing apparatus may include an input terminal 102 configured to receive at least one piece of weight data and at least one piece of neuron data of a to-be-performed neural network operation. In an embodiment, if the computing apparatus of the present disclosure is used for image data processing, the input terminal may receive image data captured by an image-capturing apparatus, where the image-capturing apparatus, for example, may be an image acquisition device, such as various image sensors, a camera, a video camera, an intelligent mobile terminal, and a tablet computer, and pixel data captured or pixel data after preliminary processing may be used as neuron data of the present disclosure.

In an embodiment, the aforementioned weight data and the aforementioned neuron data may have a same or different data format, for example, a same or different floating-point number format. Further, in one or more embodiments, the input terminal may include one or more first type transformation units for a data format transformation, where a first type transformation unit may be configured to transform weight data or neuron data that is received to a data format that is supported by a multiplication unit 104. For example, if the multiplication unit supports at least one of data formats of a half precision floating-point number, a single precision floating-point number, a brain floating-point number, a double precision floating-point number, and a self definition floating-point number, a format transformation unit of the input terminal may transform neuron data and weight data that are received to one of the aforementioned data formats to meet requirements of the multiplication unit in performing the multiplication operation. Regarding various data formats or types that are supported by the present disclosure and transformations of the data formats, the description will be detailed when the floating-point multiplier of the present disclosure is discussed below.

As shown in figure, the multiplication unit of the present disclosure may include at least one floating-point multiplier 106, where the floating-point multiplier may be configured to perform a multiplication operation of the neural network operation on the at least one piece of weight data and the at least one piece of neuron data to obtain a corresponding product result In one or more embodiments, the floating-point multiplier of the present disclosure may support a multiplication operation of one computation mode in a plurality of types of computation modes, and the computation mode may be used to indicate data formats of the neuron data and the weight data that are involved in the multiplication operation. For example, if both the neuron data and the weight data are half precision floating-point numbers, the floating-point multiplier may perform the multiplication operation in a first computation mode; if the neuron data is the half precision floating-point number, and the weight data is the single precision floating-point number, the floating-point multiplier may perform the multiplication operation in a second computation mode. Regarding details about the floating-point multiplier of the present disclosure, the description will be detailed in accompany with drawings later.

After product results are obtained through the multiplication unit of the present disclosure, the product results may be sent to an addition unit 108, and the addition unit may be configured to perform the addition operation on the product results to obtain an intermediate result. In one or more embodiments, the addition unit may be an adder group composed of a plurality of adders, and the adder group may form a tree structure. For example, the adder may include a multi-level adder group arranged in a multi-level tree structure, and each level of the adder group may include one or more first adders 110, and the first adder, for example, may be a floating-point adder. Additionally, since the floating-point multiplier of the present disclosure is a multiplier that supports a multi-mode computation, the adder in the addition unit of the present disclosure may also be an adder that supports a plurality of types of addition computation modes. For example, if an output of the floating-point multiplier is one of data formats of the half precision floating-point number, the single precision floating-point number, the brain floating-point number, the double precision floating-point number, or the self definition floating-point number, the first adder in the aforementioned addition unit of the present disclosure may also be a floating-point adder that supports a floating-point number having any one of the above data formats. In other words, solutions of the present disclosure do not limit the type of the first adder, and any apparatus, component or device that supports the addition operation may be used as the adder here to perform the addition operation and obtain the intermediate result.

After the intermediate result is obtained, the computing apparatus of the present disclosure may further include an update unit 112, which may be configured to perform multiple summation operations on a plurality of intermediate results that are generated to output a final result of the neural network operation. In some embodiments, if for one neural network operation, the multiplication unit is required to be invoked multiple times, a result obtained by invoking the multiplication unit each time and using the addition unit may be regarded as an intermediate result of the final result.

In order to perform the multiple summation operations on such the plurality of intermediate results and a reserving operation on summation results that are obtained, in one or more embodiments, the update unit may include a second adder 114 and a register 116. Considering that the first adder of the aforementioned addition unit may be a floating-point adder that supports a plurality of types of modes, accordingly, the second adder in the update unit may have the same or similar properties as the first adder; in other words, the second adder in the update unit may also support floating-point number addition operations in the plurality of types of modes. However, if the first adder or the second adder does not support an addition computation in a plurality of types of floating-point data formats, the present disclosure further discloses the first type transformation unit or a second type transformation unit, which may be used to perform a transformation between data types or formats, thereby similarly making it possible to use the first adder or the second adder to perform an addition on floating-point numbers of the plurality of types of computation modes; in other words, the first adder or the second adder may be used to perform the floating-point number addition in the plurality of types of computation modes. Regarding a type transformation unit, the description will be detailed in accompany with FIG. 11 later.

In an exemplary operation, the second adder may be configured to perform the following operations repeatedly until summation operations of all the plurality of intermediate results are completed: receiving the intermediate result from the adder (such as an adder 108) and a previous summation result from the register (such as the register 116) and a previous summation operation; summing the intermediate result and the previous summation result to obtain a summation result of a present summation operation; and by using the summation result of the present summation operation, updating the previous summation result that is stored in the register. If no new data is input into the input terminal, or after the multiplication unit completes all multiplication operations, a result that is reserved in the register may be output as the final result of the neural network operation.

In some embodiments, the input terminal may include at least two input ports that support a plurality of data bit widths, and the register may include a plurality of sub-registers, and the computing apparatus may be configured to respectively divide and reuse the neuron data and the weight data according to bit widths of the input ports, so as to perform the neural network operation. In some application scenarios, the at least two input ports may be two ports that support a bit width of k*n, where k is an integral multiple of the data type of the smallest bit width, such as k=16, 32, 64, and the like, and n is a count of pieces of input data, for example, n=1, 2, 3, and the like. For example, if k is equal to 32 and n is equal to 16, the bit width of input data may be a 521-bit width. In this case, input data of one port may be a data item including 16 pieces of FP32 (which are single precision floating-point numbers), or a data item including 32 pieces of FP16 (which are half precision floating-point numbers), or a data item including 32 pieces of BF16 (which are brain floating-point numbers). For example, if the aforementioned input port is the 512-bit width and the weight data is 2048-bit BF16 data, 2048-bit weight data may be divided into 4 pieces of 512-bit data, thereby invoking the multiplication unit and the update unit four times and outputting a final computation result after a fourth update of the update unit is completed.

Based on the above description, those skilled in the art may understand that the aforementioned multiplication unit, the addition unit and the update unit of the present disclosure may be operated independently and in parallel. For example, after outputting the product result, the multiplication unit receives a next pair of neuron data and weight data for the multiplication operation. The multiplication unit does not need to wait for next units (such as the addition unit and the update unit) to finish running before receiving and processing. Similarly, after outputting the intermediate result, the addition unit receives a next product result from the multiplication unit for the addition operation. It may be shown that a parallel operation method of solutions of the present disclosure may improve computation efficiency. Here, "next units" not only refers to the latter level, but also refers to several subsequent levels of operations in a multi-level pipeline computation operation.

The above describes an overall operation of the computing apparatus of the present disclosure in accompany with FIG. 1. By using the computing apparatus, a high-efficiency neural network operation may be implemented. Especially, by using an operation of the floating-point multiplier that supports the plurality of types of computation modes, the computing apparatus may perform the multiplication operation on the floating-point numbers of the plurality of types of data formats in the neural network. The following will describe the floating-point multiplier of the present disclosure in detailed in accompany with FIGS. 2 to 9.

Figure 2:
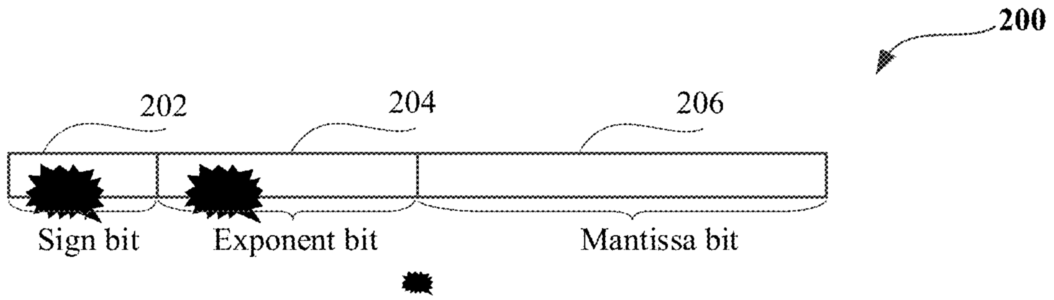
FIG. 2 is a schematic diagram of a floating-point data format according to an embodiment of the present disclosure.

FIG. 2 is a schematic diagram of a floating-point data format 200 according to an embodiment of the present disclosure. As shown in FIG. 2, neuron data and weight data that may be applied to technical solutions of the present disclosure may be a floating-point number and include three parts, for example, a sign (or a sign bit) 202, an exponent (or an exponent bit) 204, and a mantissa (or a mantissa bit) 206, where for an unsigned floating-point number, there is no sign or sign bit. In some embodiments, a floating-point number that is suitable for a multiplier of the present disclosure may include at least one of a half precision floating-point number, a single precision floating-point number, a brain floating-point number, a double precision floating-point number, and a self definition floating-point number. Specifically, in some embodiments, a floating-point number format that may be applied to technical solutions of the present disclosure may be a floating-point format conforming to an IEEE754 standard, such as the double precision floating-point number (a float64, which may be abbreviated as an "FP64"), the single precision floating-point number (a float32, which may be abbreviated as an "FP32"), or the half precision floating-point number (a float16, which may be abbreviated as an "FP16"). In some other embodiments, the floating-point number format may be an existing 16-bit brain floating-point number (a bfloat16, which may be abbreviated as a "BFP16"), or a self definition floating-point number format, such as an 8-bit brain floating-point number (a bfloat8, which may be abbreviated as a "BF8"), an unsigned half precision floating-point number (an unsigned float16, which may be abbreviated as an "UFP16"), and an unsigned 16-bit brain floating-point number (an unsigned bfloat16, which may be abbreviated as an "UBF16"). In order to facilitate understanding, a Table 1 in the following shows parts of the aforementioned data formats, where a sign bit width, an exponent bit width and a mantissa bit width are only for an illustrative purpose.

TABLE 1

| Data type | Sign bit width | Exponent bit width | Mantissa bit width |
|---|---|---|---|
| FP16 | 1 | 5 | 10 |
| BF16 | 1 | 8 | 7 |
| FP32 | 1 | 8 | 23 |
| BF8 | 1 | 5 | 3 |
| UFP16 | 0 | 5(or 6) | 11(or 10) |
| UBF16 | 0 | 8 | 8 |

For the aforementioned various floating-point number formats, in operations, the multiplier of the present disclosure may at least support a multiplication operation between two floating-point numbers (for example, one floating-point number thereof is the neuron data, and the other floating-point number thereof is the weight value number) having any one of the aforementioned formats, where the two floating-point numbers may have the same or different floating-point data formats. For example, the multiplication operation between the two floating-point numbers may be an FP16*FP16, a BF16*BF16, an FP32*FP32, an FP32*BF16, an FP16*BF16, an FP32*FP16, a BF8*BF16, an UBF16*UFP16, or an UBF16*FP16.

Figure 3:
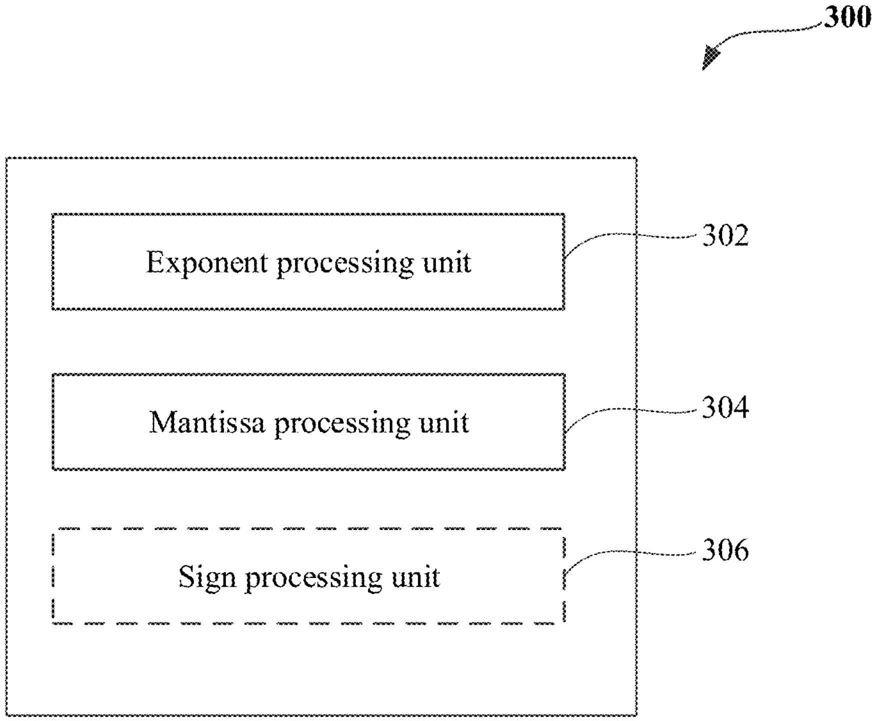
FIG. 3 is a schematic structural diagram of a multiplier according to an embodiment of the present disclosure.

FIG. 3 is a schematic structural diagram of a multiplier 300 according to an embodiment of the present disclosure. As mentioned earlier, the multiplier of the present disclosure may support multiplication operations between floating-point numbers having various data formats, where one multiplier or one multiplicand thereof may be neuron data of the present disclosure, and corresponding the other one may be weight data of the present disclosure. The aforementioned data formats may be indicated by computation modes of the present disclosure, so that the multiplier may work in one of a plurality of types of computation modes.

As shown in FIG. 3, the multiplier of the present disclosure may generally include an exponent processing unit 302 and a mantissa processing unit 304, where the exponent processing unit is used to process an exponent bit of a floating-point number, and the mantissa processing unit is used to process a mantissa bit of a floating-point number. Optionally or additionally, in some embodiments, when a floating-point number processed by the multiplier has a sign bit, the multiplier may further include a sign processing unit 306, where the sign processing unit is used to process a floating-point number having the sign bit.

In operations, according to one of the computation modes, the multiplier may perform a floating-point computation on a first floating-point number and a second floating-point number that are received, input, or cached, and the first floating-point number and the second floating-point number have one of the aforementioned floating-point data formats. For example, if the multiplier is in a first computation mode, the multiplier may support a multiplication computation between two floating-point numbers FP16*FP16. However, if the multiplier is in a second computation mode, the multiplier may support a multiplication computation between two floating-point numbers BF16*BF16. Similarly, if the multiplier is in a third computation mode, the multiplier may support a multiplication computation between two floating-point numbers FP32*FP32. However, if the multiplier is in a fourth computation mode, the multiplier may support a multiplication computation between two floating-point numbers FP32*BF16. Here, a corresponding relationship between exemplary computation modes and floating-point numbers is shown in Table 2 hereinafter.

TABLE 2

| Computation mode serial number | Computation floating-point number type |
|---|---|
| 1 | FP16*FP16 |
| 2 | BF16*BF16 |
| 3 | FP32*FP32 |
| 4 | FP32*BF16 |

Figure 17:
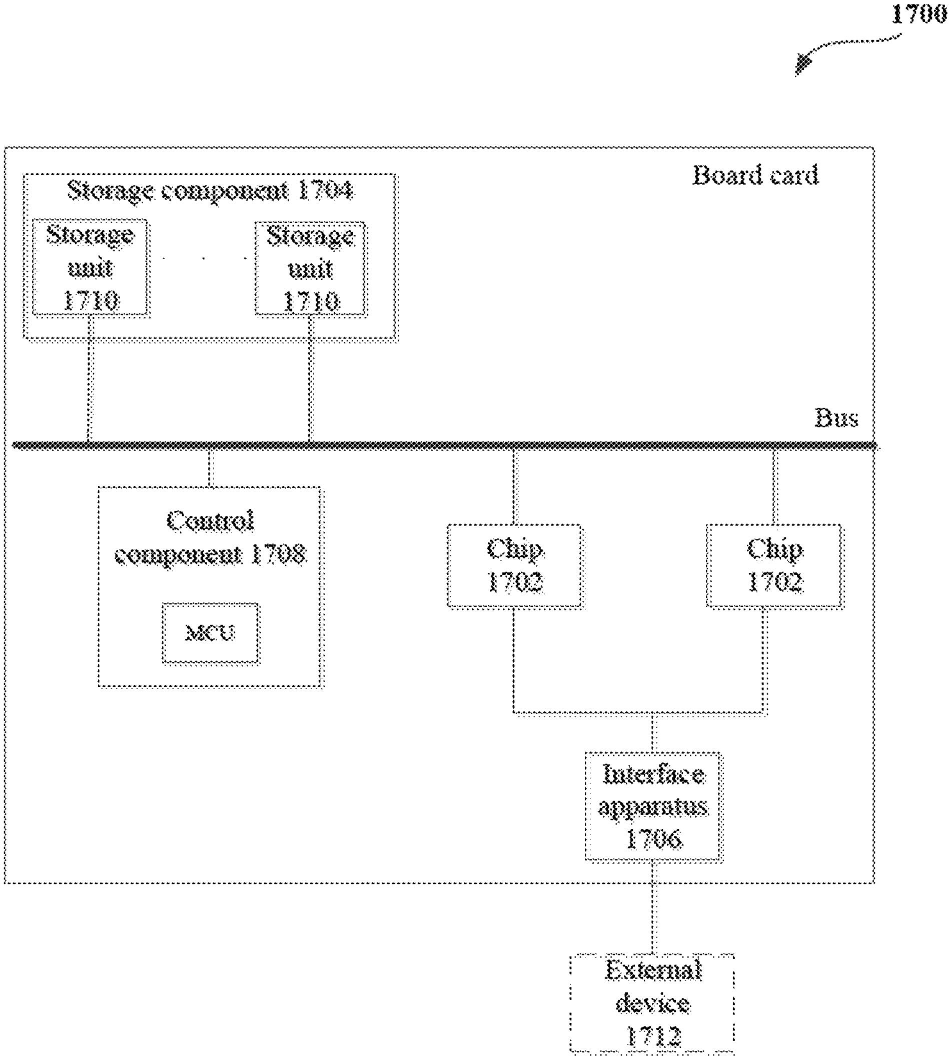
FIG. 17 is a schematic structural diagram of a board card according to an embodiment of the present disclosure.

In an embodiment, the above Table 2 may be stored in a memory of the multiplier, and the multiplier may select one of the computation modes in the table according to an instruction received from an external device, and the external device, for example, may be an external device 1712 shown in FIG. 17. In another embodiment, an input of the computation mode may be implemented automatically by a mode selection unit 408 shown in FIG. 4. For example, if two FP16-type floating-point numbers are input into the multiplier of the present disclosure, the mode selection unit may select the multiplier to work in the first computation mode according to data formats of the two floating-point numbers. For another example, if an FP32-type floating-point number and a BF16-type floating-point number are input into the multiplier of the present disclosure, the mode selection unit may select the multiplier to work in the fourth computation mode according to the data formats of the two floating-point numbers.

It may be shown that different computation modes of the present disclosure are associated with corresponding floating-point-type data. In other words, the computation mode of the present disclosure may be used to indicate a data format of the the first floating-point number and a data format of the second floating-point number. In another embodiment, the computation mode of the present disclosure may not only indicate the data format of the first floating-point number and the data format of the second floating-point number, but also indicate a data format after the multiplication computation. In connection with the Table 2, expanded computation modes may be shown in Table 3 hereinafter.

TABLE 3

| Computation mode serial number | Computation floating-point number type | Output result type |
|---|---|---|
| 11 | FP16*FP16 | FP16 |
| 12 | | BF16 |
| 13 | | FP32 |
| 21 | BF16*BF16 | FP16 |
| 22 | | BF16 |
| 23 | | FP32 |
| 31 | FP32*FP32 | FP16 |
| 32 | | BF16 |
| 33 | | FP32 |
| 41 | FP32*BF16 | FP16 |
| 42 | | BF16 |
| 43 | | FP32 |

Different from computation mode serial numbers shown in Table 2, computation modes in Table 3 may be expanded by one bit to indicate the data format after the multiplication computation. For example, if the multiplier works in a computation mode 21, the multiplier may perform a floating-point computation on two floating-point numbers BF16*BF16 that are input, and then the multiplier may output a result in a data format of FP16 after a floating-point multiplication computation.

The above indicates floating-point data formats by using computation mode serial numbers, which is illustrative but not restrictive. According to the teaching of the present disclosure, it is also conceivable to establish an index according to the computation mode to determine formats of the multiplier and the multiplicand. For example, the computation mode may include two indexes, and a first index may be used to indicate a type of the first floating-point number, and a second index may be used to indicate a type of the second floating-point number. For example, in a computation mode 13, a first index "1" may indicate that the first floating-point number (or called the multiplicand) is a first floating-point format, which is FP16, and a second index "3" may indicate that the second floating-point number (or called the multiplier) is a second floating-point format, which is FP32. Further, a third index may be added to the computation mode. The third index may indicate a data format of an output result. For example, in a computation mode 131, a third index "1" may indicate that the data format of the output result is the first floating-point format, which is FP16. As the number of computation modes increases, according to requirements, a corresponding index or the level of the index may be added, so as to determine the relationship between the computation modes and the data formats.

Additionally, although here illustratively uses serial numbers to indicate the computation modes, in other examples, according to application needs, other signs or codes may be used to indicate the computation modes, for example, letters, signs, numbers or combinations thereof, and the like. Through these expressions including letters, numbers, signs or combinations thereof, the computation modes may be indicated and the data formats of the first floating-point number, the second floating-point number and the output result may be identified. Additionally, when these expressions are formed in the form of an instruction, the instruction may include three domains or three fields, where a first domain is used to indicate the data format of the first floating-point number, and a second domain is used to indicate the data format of the second floating-point number, and a third domain is used to indicate the data format of the output result. Of course, these domains may be merged into one domain, or may be added to a new domain to indicate more contents related to the floating-point data format. It may be shown that the computation modes of the present disclosure may not only be associated with the data formats of the floating-point numbers input, but also be used to normalize the output result, so as to obtain a product result with an expected data format.

Figure 4:
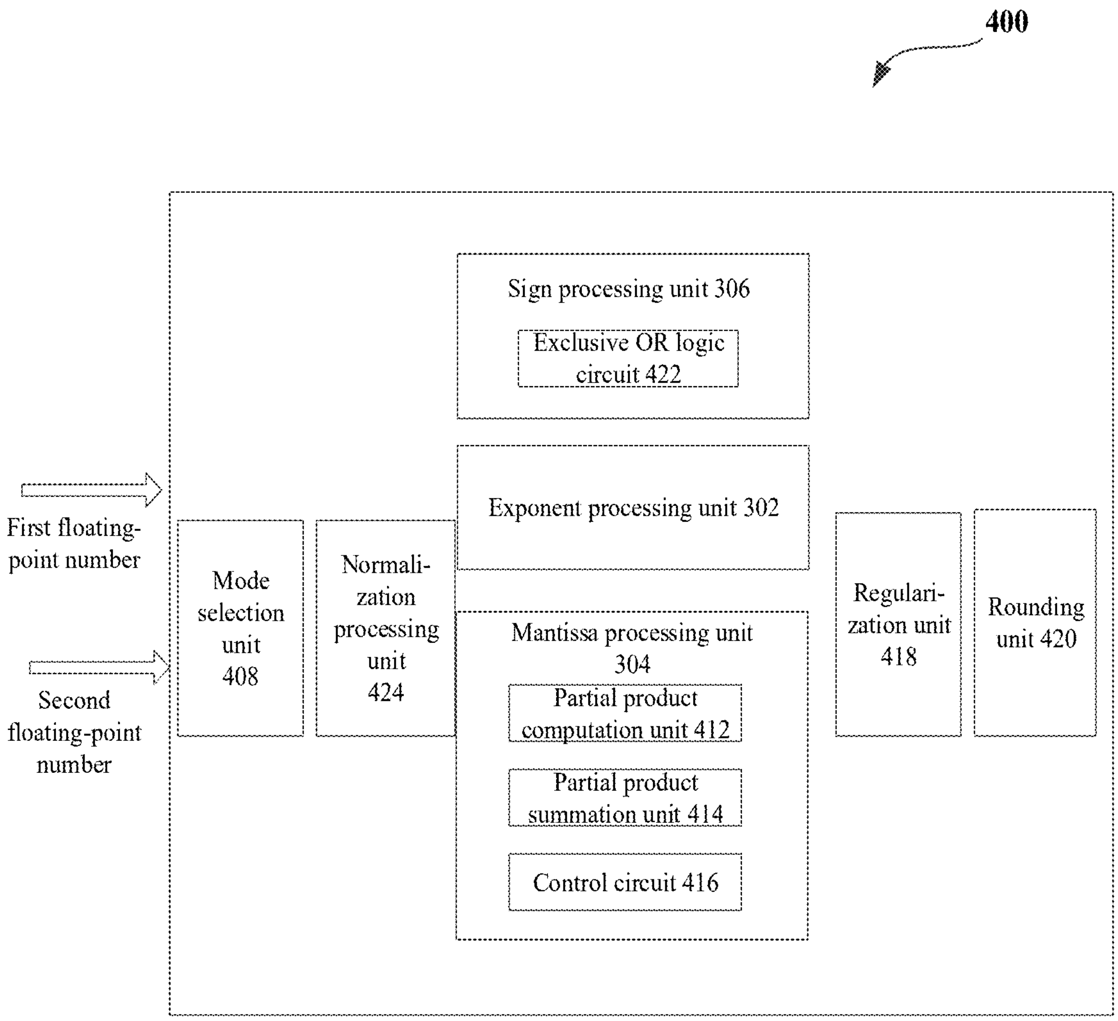
FIG. 4 is a structural block diagram illustrating more details about a multiplier according to an embodiment of the present disclosure.

FIG. 4 is a structural diagram illustrating more details about a multiplier 400 according to an embodiment of the present disclosure. From the content of FIG. 4, it may be shown that FIG. 4 not only includes the exponent processing unit 302, the mantissa processing unit 304 and the sign processing unit 306 that is optional shown in FIG. 3, but also shows internal components that these units may include and units related to operations of these units. Exemplary operations of these units are described in detail below with reference to FIG. 4.

In order to perform a floating-point number multiplication computation, for example, a multiplication computation between neuron data and weight data of the present disclosure, the exponent processing unit may be used to obtain an exponent after the multiplication computation according to the aforementioned computation mode, an exponent of a first floating-point number, and an exponent of a second floating-point number. In an embodiment, the exponent processing unit may be implemented through an addition and subtraction circuit. For example, here, the exponent processing unit may be used to sum the exponent of the first floating-point number and an offset of an input floating-point data format corresponding to the first floating-point number, and sum the exponent of the second floating-point number and an offset of an input floating-point data format corresponding to the second floating-point number, and then subtract offsets of output floating-point data formats, so as to obtain an exponent of the first floating-point number after the multiplication computation and an exponent of the second floating-point number after the multiplication computation.

Further, the mantissa processing unit of the multiplier may be used to obtain a mantissa after the multiplication computation according to the aforementioned computation mode, the first floating-point number and the second floating-point number. In an embodiment, the mantissa processing unit may include a partial product computation unit 412 and a partial product summation unit 414, where the partial product computation unit may be used to obtain a mantissa intermediate result according to a mantissa of the first floating-point number and a mantissa of the second floating-point number. In some embodiments, the mantissa intermediate result may be a plurality of partial products obtained during a multiplication operation between the first floating-point number and the second floating-point number (as illustratively shown in FIG. 6 and FIG. 7). The partial product summation unit may be used to perform a summation computation on mantissa intermediate results to obtain a summation result and then take the summation result as the mantissa after the multiplication computation.

In order to obtain the mantissa intermediate result, in an embodiment, the present disclosure uses a Booth encoding circuit to fill high and low bits of the mantissa of the second floating-point number (for example, acting as a multiplier in a floating-point computation) with 0 (where filling the high bits with 0 is to take the mantissa as an unsigned number to be transformed to a signed number), so as to obtain the mantissa intermediate result. It needs to be understood that, according to different encoding methods, the mantissa of the first floating-point number (for example, acting as a multiplicand in the floating-point computation) may be encoded (for example, filling the high and low bits with 0), or both the mantissa of the first floating-point number and the mantissa of the second floating-point number may be encoded, so as to obtain the plurality of partial products. More descriptions about a partial product may be made later in combination with drawings.

In another embodiment, the partial product summation unit may include an adder, where the adder may be used to sum the mantissa intermediate results to obtain the summation result. In another embodiment, the partial product summation unit may include a Wallace tree and the adder, where the Wallace tree may be used to sum the mantissa intermediate results to obtain a second mantissa intermediate result, and the adder may be used to sum second mantissa intermediate results to obtain the summation result. In these embodiments, the adder may include at least one of a full adder, a serial adder, and a carry-lookahead adder.

In an embodiment, the mantissa processing unit may further include a control circuit 416. The control circuit 406 may be used to invoke the mantissa processing unit multiple times according to the computation mode when a computation unit indicates that a mantissa bit width of at least one of the first floating-point number or the second floating-point number is greater than a data bit width that is processable by the mantissa processing unit at one time. The control circuit, in an embodiment, may be implemented to be used to generate a control signal, for example, a counter or an indicating bit of control, and the like. In order to achieve multiple invocations here, the partial product summation unit may further include a shifter. When the control circuit invokes the mantissa processing unit multiple times according to the computation mode, the shifter may be used to shift an existing summation result in each invocation and then add a shifted summation result to a summation result obtained in a current invocation to obtain a new summation result and take a new summation result obtained in a final invocation as the mantissa after the multiplication computation.

In an embodiment, the multiplier of the present disclosure may further include a regularization unit 418 and a rounding unit 420. The regularization unit may be used to perform floating-point number regularization processing on the mantissa after the multiplication computation and the exponent after the multiplication computation to obtain a regularized exponent result and a regularized mantissa result and take the regularized exponent result as the exponent after the multiplication computation and take the regularized mantissa result as the mantissa after the multiplication computation. For example, according to a data format indicated by the computation unit, the regularization unit may adjust a bit width of the exponent and a bit width of the mantissa to make the exponent and the mantissa meet the requirements of the data format indicated above. Additionally, the regularization unit may make other adjustments to the exponent or the mantissa. For example, in some application scenarios, if a value of the mantissa is not 0, the most significant bit of a mantissa bit should be 1; otherwise, an exponent bit may be modified and the mantissa bit may be shifted at the same time to make it into the form of a normalized number. In another embodiment, the regularization unit may adjust the exponent after the multiplication computation according to the mantissa after the multiplication computation. For example, if the highest bit of the mantissa after the multiplication computation is 1, the exponent obtained after the multiplication computation may be added with 1. Accordingly, the rounding unit may be used to perform a rounding operation on the regularized mantissa result according to a rounding mode and take a mantissa after the rounding operation as the mantissa after the multiplication computation. According to different application scenarios, the rounding unit may perform rounding operations, including rounding down, rounding up, and rounding to the nearest significand. In some application scenarios, the rounding unit may further round the 1 shifted from a process of shifting the mantissa to the right.

Other than the exponent processing unit and the mantissa processing unit, the multiplier of the present disclosure may optionally include a sign processing unit. When a floating-point number that is input is a floating-point number with a sign bit, the sign processing unit may be used to obtain a sign after the multiplication computation according to a sign of the first floating-point number and a sign of the second floating-point number. For example, in an embodiment, the sign processing unit may include an exclusive OR logic circuit 422. The exclusive OR logic circuit may be used to perform an exclusive OR operation on the sign of the first floating-point number and the sign of the second floating-point number to obtain the sign after the multiplication computation. In another embodiment, the sign processing unit may be implemented through a true-value table or a logical judgment.

Additionally, in order to make the first floating-point number and the second floating-point number that are input or received conform to a specified format, in an embodiment, the multiplier of the present disclosure may further include a normalization processing unit 424. The normalization processing unit 424 may be used to perform normalization processing on the first floating-point number or the second floating-point number according to the computation mode when the first floating-point number or the second floating-point number is a non-normalized and non-zero floating-point number, so as to obtain a corresponding exponent and a corresponding mantissa. For example, when a selected computation mode is a second computation mode shown in Table 2 while the first floating-point number and the second floating-point number that are input are FP16-type data, the normalization processing unit may be used to normalize the FP16-type data to BF16-type data, so that the multiplier may be operated in the second computation mode. In one or more embodiments, the normalization processing unit may be further used to perform preprocessing (for example, the expanding of the mantissas) on a mantissa of a normalization floating-point number having a hidden 1 and a mantissa of a non-normalization floating-point number without the hidden 1, so as to facilitate a subsequent operation of the mantissa processing unit. Based on the above description, it may be understood that the normalization processing unit 424 here and the aforementioned regularization unit 418 in some embodiments may perform the same or similar operations. The difference is that the normalization processing unit 424 is used for performing the normalization processing on floating-point data that is input, while the regularization unit 418 is used for performing the regularization processing on the mantissa and the exponent that are to be output.

The above describes the multiplier of the present disclosure and a plurality of embodiments of the multiplier of the present disclosure in combination with FIG. 4. Based on the above description, those skilled in the art may understand that solutions of the present disclosure obtains results after the multiplication computation (including the exponent, the mantissa and the sign that is optional) by executing the multiplier. According to different application scenarios, for example, if the aforementioned regularization processing and rounding processing are not required, results obtained by the mantissa processing unit and the exponent processing unit may be regarded as a computation result of a floating-point multiplier. Further, if the aforementioned regularization processing and rounding processing are required, the exponent and the mantissa obtained after the regularization processing and the rounding processing may be regarded as the computation result of the floating-point multiplier, or a part of the computation result of the floating-point multiplier (when a final sign is considered). Further, according to the solutions of the present disclosure, a plurality of types of computation modes are used to enable the multiplier to support a computation of floating-point numbers of different types or data formats, thereby realizing a reuse of the multiplier and saving overheads of chip design and calculation costs. Additionally, through a multiple invocation mechanism, the multiplier of the present disclosure may further support calculations of a floating-point number with a high bit width. Since in a floating-point number multiplication operation, a multiplication operation on the mantissa (or called the mantissa bit or a mantissa part) is critical to performance of an entire floating-point computation. The following will describe a mantissa operation of the present disclosure in combination with FIG. 5.

Figure 5:
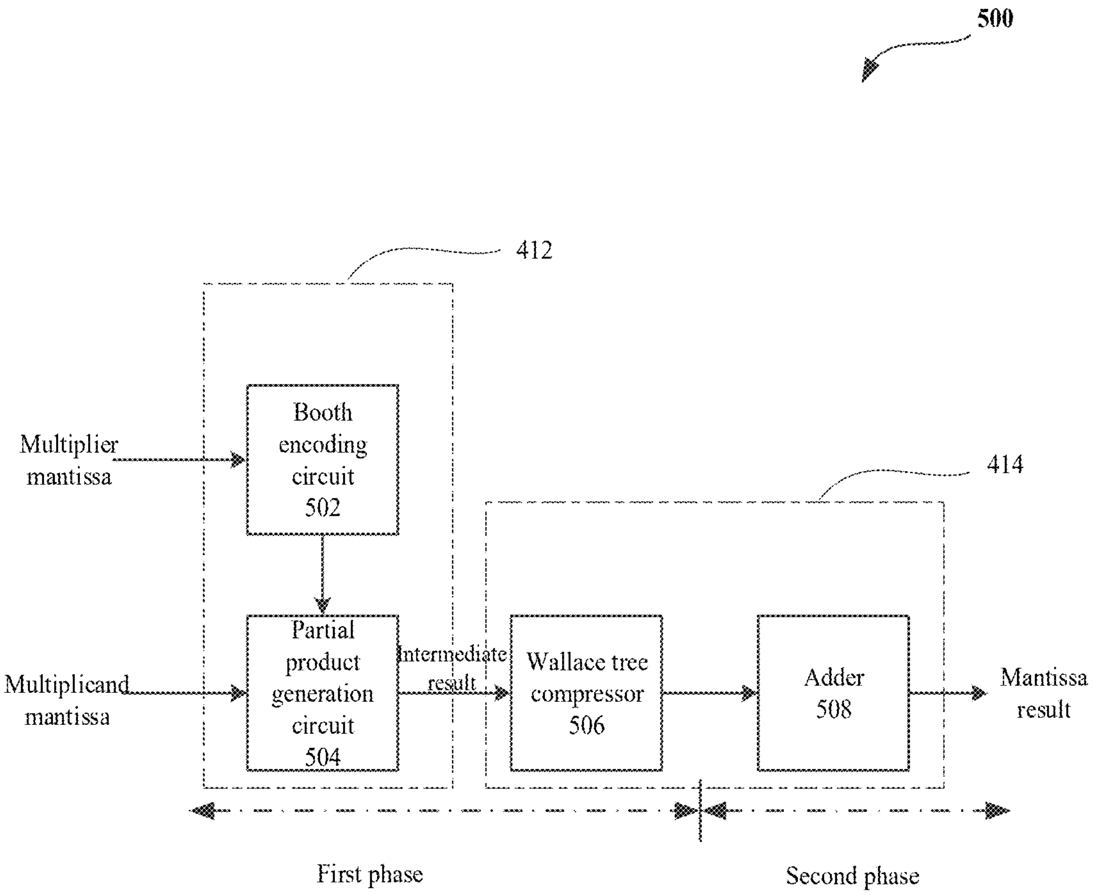
FIG. 5 is a schematic block diagram of a mantissa processing unit according to an embodiment of the present disclosure.

FIG. 5 is a schematic diagram of a mantissa processing unit operation 500 according to an embodiment of the present disclosure. As shown in FIG. 5, a mantissa processing operation of the present disclosure involves two units, which are the partial product computation unit and the partial product summation unit that are described above in combination with FIG. 4. In terms of operating sequence, the mantissa processing operation may be generally divided into a first phase and a second phase, where in the first phase, the mantissa processing operation may obtain the mantissa intermediate result, and in the second phase, the mantissa processing operation may obtain a mantissa result output from an adder 508.

In an exemplary specific operation, the first floating-point number and the second floating-point number that are received by the multiplier may be divided into a plurality of parts, which are the aforementioned sign (which is optional), the exponent, and the mantissa. Optionally, after normalization processing, mantissa parts of the two floating-point numbers may enter the mantissa processing unit (such as the mantissa processing unit 304 in FIG. 3 or FIG. 4) as inputs, and specifically enter the partial product computation unit. As shown in FIG. 5, the present disclosure uses a Booth encoding circuit 502 to fill the high and low bits of the mantissa of the second floating-point number (which is the multiplier in the floating-point computation) with 0 and perform Booth encoding processing, so as to obtain the mantissa intermediate result in a partial product generation circuit 504. Of course, here, the first floating-point number and the second floating-point number are used for illustrative but not restrictive purposes only. Therefore, in some application scenarios, the first floating-point number may be the multiplier and the second floating-point number may be the multiplicand. Accordingly, in some encoding processing, an encoding operation may also be performed on the floating-point number that acts as the multiplicand.

In order to better understand technical solutions of the present disclosure, Booth encoding will be described briefly hereinafter. Generally, when the multiplication operation is performed on two binary numbers, through the multiplication operation, a large number of mantissa intermediate results called partial products may be generated, and then an accumulation operation may be performed on these partial products to obtain a final result of multiplying the two binary numbers. The greater the number of partial products, the larger the area and power consumption of an array floating-point multiplier, the slower the execution speed, and the more difficult it is to implement the circuit. However, a purpose of the Booth encoding is to effectively decrease the number of summation terms of the partial products and further reduce the area of the circuit. The algorithm of the Booth encoding is to encode the multiplier that is input according to corresponding rules first. In an embodiment, encoding rules may be rules shown in Table 4 below.

TABLE 4

| To-be-encoded data | | | Encoding signal |
|---|---|---|---|
| $y_{2i+1}$ | $y_{2i}$ | $y_{2i-1}$ | PPi |
| 0 | 0 | 0 | 0 |
| 0 | 0 | 1 | X |
| 0 | 1 | 0 | X |
| 0 | 1 | 1 | 2X |
| 1 | 0 | 0 | −2X |
| 1 | 0 | 1 | −X |
| 1 | 1 | 0 | −X |
| 1 | 1 | 1 | −0(=0) |

In Table 4, $y_{2i+1}$, $y_{2i}$, and $y_{2i-1}$ may represent values corresponding to each group of to-be-encoded sub-data (which is the multiplier), and X may represent the mantissa of the first floating-point number (which is the multiplicand). After the Booth encoding processing on each group of corresponding to-be-encoded data is performed, corresponding encoding signals PPi (i=0, 1, 2, . . . , n) may be obtained. As schematically shown in Table 4, encoding signals obtained after the Booth encoding may include five types, including −2X, 2X, −X, X, and 0. Illustratively, based on the above-mentioned encoding rules, if the multiplicand that is received is a piece of 8-bit data "$X_7X_6X_5X_4X_3X_2X_1X_0$", the following partial products may be obtained.

(1) If a multiplier bit includes consecutive three pieces of data "001" in the above table, the partial product is X and may be expressed as "$X_7X_6X_5X_4X_3X_2X_1X_0$", and the ninth bit is the sign bit; in other words, PPi={X[7], X}; (2) if the multiplier bit includes consecutive three pieces of data "011" in the above table, the partial product is 2X and represents that X is shifted to the left by one bit to obtain "$X_7X_6X_5X_4X_3X_2X_1X_0$0"; in other words, PPi={X, 0}; (3) if the multiplier bit includes consecutive three pieces of data "101" in the above table, the partial product is −X and may be expressed as "$\overline{X_7X_6X_5X_4X_3X_2X_1X_0}$+1" representing inverting "$X_7X_6X_5X_4X_3X_2X_1X_0$" bit by bit and then adding 1, which is PPi=~{X[7], X}+1; (4) if the multiplier bit includes consecutive three pieces of data "100" in the above table, the partial product is −2X and may be expressed as "$\overline{X_7X_6X_5X_4X_3X_2X_1X_0}$1+1" representing shifting "$X_7X_6X_5X_4X_3X_2X_1X_0$" to the left by one bit, inverting, and adding 1, which is PPi=~{X, 0}+1; (5) if the multiplier bit includes consecutive three pieces of data "111" or "000" in the above table, the partial product is 0, which is PPi={9' b0}.

It should be understood that the above description of a process of obtaining the partial products in combination with Table 4 is only exemplary but not restrictive. Under the teaching of the present disclosure, those skilled in the art may change rules shown in Table 4 to obtain a partial product different from those partial products shown in Table 4. For example, if the multiplier bit includes a specific number having consecutive multiple bits (for example, 3 bits or more than 3 bits), the partial product obtained may be a complement code of the multiplicand, or for example, an "adding 1" operation in (3) and (4) above may be performed after the partial products are summed.

Based on the above introductory description, it may be understood that by encoding the mantissa of the second floating-point number by using the Booth encoding circuit, and based on the mantissa of the first floating-point number, the plurality of partial products may be generated from the partial product generation circuit as the mantissa intermediate results, and the mantissa intermediate results may be input into a Wallace tree compressor 506 in the partial product summation unit. It should be understood that here, using the Booth encoding to obtain the partial product is only a preferred method for obtaining the partial product in the present disclosure, and those skilled in the art may also obtain the partial product in other ways. For example, a shifting operation may also be used to obtain the partial product. In other words, according to whether the bit value of the multiplier is 1 or 0, a shift plus the multiplicand or a shift plus 0 may be selected to obtain a corresponding partial product. Similarly, using the Wallace tree compressor to perform an addition operation of the partial products is only exemplary but not restrictive, and those skilled in the art may perform the addition operation of the partial products by using other types of adders. Other types of adders may be one or more full adders, half adders or various combinations thereof.

Regarding the Wallace tree compressor (a Wallace tree for short), the Wallace tree compressor is mainly used to sum the mantissa intermediate results (for example, the plurality of partial products), so as to reduce the number of times of accumulating the partial products (for example, compression). Generally, the Wallace tree compressor may adopt a carry-save (CAS) structure and a Wallace tree algorithm, and the calculation speed of the Wallace tree compressor by using a Wallace tree array is much faster than that of using the addition of a traditional carry-propagate structure.

Specifically, the Wallace tree compressor may sum the partial products in each row in parallel. For example, the number of times of accumulating N partial products may be decreased from N−1 to $\text{Log}_2N$, thereby improving the speed of the multiplier, which is of great significance to the effective use of resources. According to different application needs, the Wallace tree compressor may be designed to a plurality of types, such as a 7-2 Wallace tree, a 4-2 Wallace tree, and a 3-2 Wallace tree, and the like. In one or more embodiments, the present disclosure uses the 7-2 Wallace tree as an example for performing various floating-point computations of the present disclosure. More detailed descriptions may be made later in combination with FIG. 5 and FIG. 6.

In some embodiments, a Wallace tree compression operation of the present disclosure may be arranged with M inputs and N outputs, and the number of Wallace trees may not be less than K, where N is a preset positive integer that is less than M, and K is a positive integer that is not less than the largest bit width of the mantissa intermediate result. For example, M may be 7, and N may be 2, which is the 7-2 Wallace tree that will be detailed in the following. If the largest bit width of the mantissa intermediate result is 48, K may be a positive integer 48; in other words, the number of Wallace trees may be 48.

In some embodiments, according to the computation mode, one or a plurality of groups of Wallace trees may be selected to sum the mantissa intermediate results, where each group has X Wallace trees, and X is the bit number of the mantissa intermediate results. Further, there is a sequential carry relationship between the Wallace trees within each group, but there is no carry relationship between each group. In an exemplary connection, the Wallace tree compressor may be connected through a carry. For example, a carry output (such as a Cin in FIG. 7) from a low-bit Wallace tree compressor may be entered to a high-bit Wallace tree, while a carry output (such as a Cout) from the high-bit Wallace tree compressor may be a higher-bit Wallace tree compressor to receive the carry input from the low-bit Wallace tree compressor. Additionally, when one or more Wallace tree compressors are selected from a plurality of Wallace tree compressors, the selection may be made arbitrarily. For example, the selection may be made based on a number sequence in order of 0, 1, 2, and 3, and the like, or based on a number sequence in order of 0, 2, 4, and 6, and the like, as long as the selected Wallace tree compressors are selected according to the above-mentioned carry relationship.

The following will introduce the above Wallace tree and operations of the Wallace tree in combination with an illustrative example. Assuming that the first floating-point number (for example, one piece of the neuron data or the weight data of the present disclosure) and the second floating-point number (for example, the other piece of the neuron data or the weight data of the present disclosure) are 16-bit data, the multiplier supports a 32-bit input bit width (thereby supporting a parallel multiplication operation on two groups of 16-bit data), and the Wallace tree is the 7-2 Wallace tree compressor with 7 (which is an exemplary value of the above M) inputs and 2 (which is an exemplary value of the above N) outputs. In this exemplary scenario, 48 (which is an exemplary value of the above K) Wallace trees may be adopted to complete the multiplication computation on the two groups of data in parallel.

In the aforementioned 48 Wallace trees, 0th to 23rd Wallace trees (which are 24 Wallace trees in a first group of Wallace trees) may complete a partial product summation computation of the multiplication computation of the first group, and each Wallace tree in this group may be connected through the carry sequentially. Further, 24th to 47th Wallace trees (which are 24 Wallace trees in a second group of Wallace trees) may complete a partial product summation computation of the multiplication computation of the second group, where each Wallace tree in this group may be connected through the carry sequentially. Additionally, there is no carry relationship between a 23rd Wallace tree in the first group and a 24th Wallace tree in the second group; in other words, there is no carry relationship between Wallace trees of different groups.

Returning to FIG. 5, after the partial products are summed and compressed through the Wallace tree compressor, the partial products that are compressed may be summed through the adder, so as to obtain a result of the mantissa multiplication operation. Regarding the adder, in one ore a plurality of embodiments of the present disclosure, the adder may include one of the full adder, the serial adder and the carry-lookahead adder. The adder may be used to perform a summation operation on partial products in the last two rows obtained by summing by the Wallace tree compressor, so as to obtain the result of the mantissa multiplication operation.

It may be understood that through the mantissa multiplication operation shown in FIG. 5, especially by illustratively using the Booth encoding and the Wallace tree, the result of the mantissa multiplication operations may be obtained effectively. Specifically, the Booth encoding processing may effectively decrease the number of summation terms of the partial products and further reduce the area of the circuit, while the Wallace tree compressor may sum the partial products in each row in parallel and further improve the speed of the multiplier.

Figure 6:
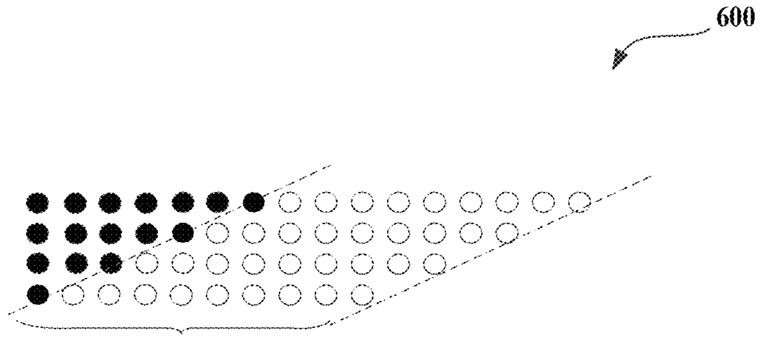
FIG. 6 is a schematic diagram of a partial product operation according to an embodiment of the present disclosure.
Figure 7:
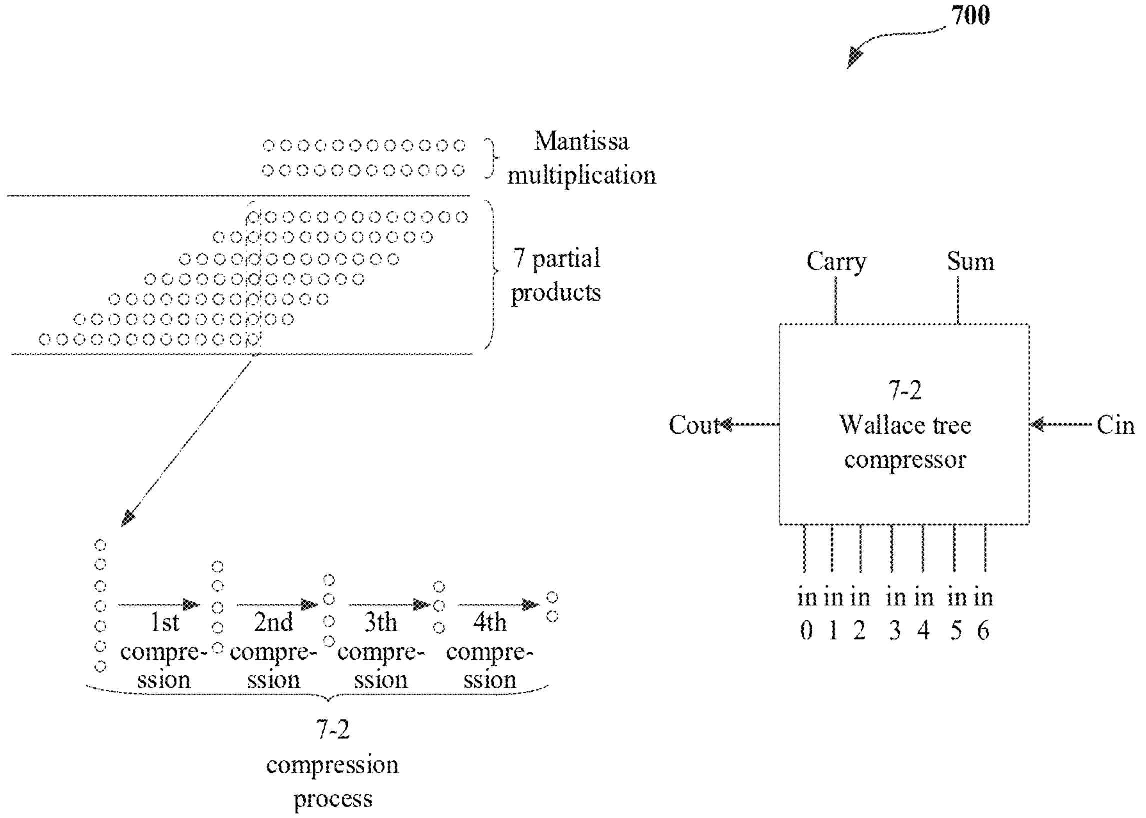
FIG. 7 is an operation process and a schematic block diagram of a Wallace tree compressor according to an embodiment of the present disclosure.

The following will describe exemplary operations of the partial product and the 7-2 Wallace tree in combination with FIG. 6 and FIG. 7. It may be understood that the description here is only exemplary but not restrictive and aims to better understand the solutions of the present disclosure.

FIG. 6 shows a partial product 600 obtained after passing through the partial product generation circuit in the mantissa processing unit described in combination with FIGS. 3 to 5, such as four rows of white dots between two dashed lines in figure, where each row of white dots identifies one partial product. In order to facilitate a subsequent execution of a Wallace tree compressor, a bit number may be expanded in advance. For example, black dots in FIG. 6 are values of the most significant bits of each copied 9-bit partial product. It may be known that partial products are expanded to be aligned to 16(8+8) bits (which are 8-bit width of a multiplicand mantissa +8-bit width of a multiplier mantissa). In another embodiment, for example, for a partial product of a 25*13 binary multiplication, the partial product may be expanded to 38(25+13) bits (which are 25-bit width of the multiplicand mantissa +13-bit width of the multiplier mantissa).

FIG. 7 is an operation process and a schematic block diagram 700 of a Wallace tree compressor according to an embodiment of the present disclosure.

As shown in FIG. 7, after a multiplication operation on mantissas of two floating-point numbers is performed, for example, as described earlier, by performing Booth encoding on a multiplier and based on a multiplicand, 7 partial products shown in FIG. 7 may be obtained. Due to the use of Booth encoding algorithm, the number of partial products generated may be decreased. In order to facilitate understanding, in a partial product part of the figure, a dashed box is used to identify a Wallace tree including 7 elements, and a compression process of the Wallace tree from 7 elements to 2 elements is further shown with arrows. In an embodiment, a compression process (or called a summation process) may be implemented by using a full adder; in other words, three elements may be input and two elements may be output (which are one “sum” and one “carry” for high bits). The schematic block diagram of a 7-2 Wallace tree compressor is shown in a right side of FIG. 7. It may be understood that the Wallace tree compressor includes 7 inputs from one column of partial products (such as seven elements that are identified in a dashed box in a left side of FIG. 7) In operations, a carry input of a 0th column of the Wallace tree is 0, and a carry output Cout of each column of the Wallace tree may be used as a carry input Cin of a next column of the Wallace tree.

From a left part of FIG. 7, it may be shown that after four compressions, the Wallace tree including 7 elements may be compressed to a Wallace tree including 2 elements. As mentioned earlier, the present disclosure uses the 7-2 Wallace tree compressor to compress 7 rows of partial products to 2 rows of partial products finally (which are second mantissa intermediate results of the present disclosure), and the present disclosure uses an adder (such as a carry-lookahead adder) to obtain a mantissa result.

In order to further explain principles of solutions of the present disclosure, the following will illustratively describe how the multiplier of the present disclosure completes operations in a first phase in four computation modes including an FP16*FP16, an FP16*FP16, an FP32*FP32, and an FP32*BF16, until the Wallace tree compressor completes a summation of the mantissa intermediate results to obtain a second mantissa intermediate result.

(1) FP16* FP16

In this computation mode of the multiplier, a mantissa bit of a floating-point number is 10 bits, and considering a non-normalized and non-zero number under an IEEE754 standard, the mantissa bit of the floating-point number may be expanded by 1 bit, and the mantissa bit may be 11 bits. Additionally, since the mantissa bit is a unsigned number, when a Booth encoding algorithm is adopted, a high bit may be expanded by 1-bit 0 (which is to fill the high bit with one 0), and therefore, a total mantissa bit number may be 12 bits. When Booth encoding is performed on a second floating-point number, and referring to the first floating-point number, through a partial product generation circuit, 7 partial products may be obtained in high and low parts respectively, where a 7th partial product is 0, and a bit width of each partial product is 24 bits, and at this time, compression processing may be performed through 48 7-2 Wallace trees, where a carry from a 23rd Wallace tree to a 24th Wallace tree is 0.

(2) BF16* BF16

In this computation mode of the multiplier, the mantissa bit of the floating-point number is 7 bits, and considering that under the IEEE754 standard, the non-normalized and non-zero number may be expanded to be a signed number, a mantissa may be expanded to 9 bits. When the Booth encoding is performed on the second floating-point number, and referring to the first floating-point number, through the partial product generation circuit, 7 effective partial products may be obtained in the high and low parts respectively, where both a 6th partial product and a 7th partial product are 0, and the bit width of each partial product is 18 bits, and the compression processing may be performed through two groups of 7-2 Wallace trees, including 0th to 17th Wallace trees and 24th to 41st Wallace trees, where the carry from the 23rd Wallace tree to the 24th Wallace tree is 0.

(3) FP32*FP32

In this computation mode of the multiplier, the mantissa bit of the floating-point number is 23 bits, and considering the non-normalized and non-zero number under the IEEE754 standard, the mantissa may be expanded to 24 bits. In order to save an area of a multiplication unit, the multiplier of the present disclosure may be invoked twice to complete one computation in this computation mode. Therefore, a multiplication operated in the mantissa bit each time is 25bit*13bit, which is to expand a first floating-point number ina into a 25-bit signed number with 1-bit 0 and divide a 24-bit mantissa bit of a second floating-point number inb into 12 bits in a high part and 12 bits in a low part and then respectively expand the high and low parts with 1-bit 0 to obtain two 13-bit multipliers, which are expressed as an inb_high13 in the high part and an inb_low13 in the low part. In a specific operation, the multiplier of the present disclosure may be invoked to calculate an ina*inb_low13 for the first time, and the multiplier may be invoked to calculate an ina*inb_high13 for the second time. In each calculation, based on the Booth encoding, the 7 effective partial products may be generated, and the bit width of each partial product is 38 bits, and the compression processing may be performed through 0th to 37th Wallace trees of the 7-2 Wallace tree.

(4) FP32* BF16

In this computation mode of the multiplier, the mantissa bit of the first floating number ina is 23 bits, and the mantissa bit of the second floating-point number inb is 7 bits. Considering that under the IEEE754 standard, the non-normalized and non-zero number may be expanded to the signed number, mantissas may be expanded into 25 bits and 9 bits respectively, and then a multiplication of 25 bits×9 bits may be performed to obtain the 7 effective partial products, where both the 6th partial product and the 7th partial product are 0, and the bit width of each partial product is 34 bits, and the compression processing may be performed through 0th to 33rd Wallace trees.

Based on specific examples, the above describes how the multiplier of the present disclosure completes the operations in the first phase in the four computation modes, where the Booth encoding algorithm and the 7-2 Wallace tree are preferably used. Based on the above description, those skilled in the art may understand that the present disclosure uses the 7 partial products, which make it possible to reuse the 7-2 Wallace tree in different computation modes.

In some computation modes, the aforementioned mantissa processing unit may further include a control circuit. The control circuit may be used to invoke the mantissa processing unit multiple times according to a computation mode when a mantissa bit width of the first floating-point number and/or a mantissa bit width of the second floating-point number that are indicated by the computation mode are greater than a data bit width that is processable by the mantissa processing unit at one time. Further, in the case of multiple invocations, the partial product summation unit may further include a shifter. When the mantissa processing unit is invoked multiple times according to the computation mode, in the case of having a summation result, the shifter is used to shift an existing summation result and add a shifted summation result to a summation result obtained in a current invocation to obtain a new summation result and take the new summation result as a mantissa after the multiplication computation.

For example, as mentioned earlier, the mantissa processing unit may be invoked twice in a computation mode of FP32*FP32. Specifically, in a first invocation of the mantissa processing unit, the mantissa bit (which is the ina*inb_low13) may be summed through the carry-lookahead adder in a second phase to obtain a second low-bit mantissa intermediate result, and in a second invocation of the mantissa processing unit, the mantissa bit (which is the ina*inb_high13) may be summed through the carry-lookahead adder in the second phase to obtain a second high-bit mantissa intermediate result. Hereafter, in an embodiment, the second low-bit mantissa intermediate result and the second high-bit mantissa intermediate result may be accumulated by a shift operation of the shifter, so as to obtain the mantissa after the multiplication computation. The shift operation may be represented by the following formula.

$$r_{fp32xfp32}=\mathrm{sum}_h[37:0]<<12+\mathrm{sum}_l[37:0]$$

In other words, the shift operation is to shift a second high-bit mantissa intermediate result $\mathrm{sum}_h[37:0]$ to the left by 12 bits and accumulate the shifted second high-bit intermediate result with a second low-bit intermediate result $\mathrm{sum}_l[37:0]$.

In combination with FIGS. 5 to 7, the above describes operations of the multiplier of the present disclosure on a multiplication between a mantissa of the first floating-point number and a mantissa of the second floating-point number when a floating-point computation is performed in detailed. Of course, in order to focus on the description of the operation of the mantissa processing unit of the multiplier of the present disclosure, FIG. 5 does not draw and describe other units, such as the exponent processing unit and the sign processing unit. The following will make an overall description of the multiplier of the present disclosure in combination with FIG. 8. The foregoing description of the mantissa processing unit also applies to a situation depicted in FIG. 8.

Figure 8:
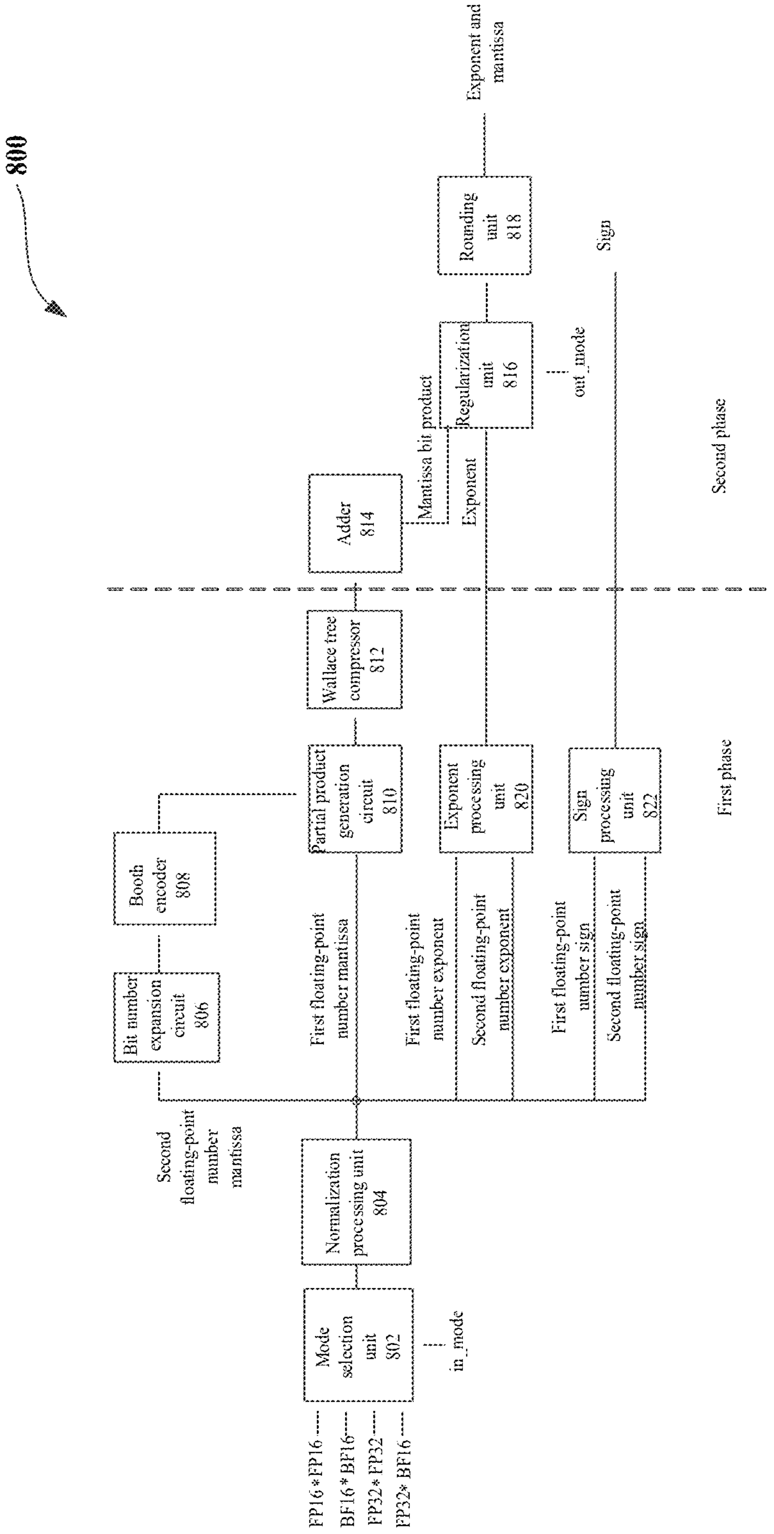
FIG. 8 is an overall schematic block diagram of a multiplier according to an embodiment of the present disclosure.

FIG. 8 is an overall schematic block diagram of a multiplier 800 according to an embodiment of the present disclosure. It needs to be understood that positions, existence, and connection relationships of various units depicted in figure are merely exemplary but not restrictive. For example, some of the units may be integrated, while other units may also be separated, omitted or replaced according to different application scenarios.

The multiplier of the present disclosure may be exemplarily divided into a first phase and a second phase according to an operation flow in an operation of each computation mode, as shown by a dotted line in the figure. In general, in the first phase: a calculation result of a sign bit may be output, a mantissa intermediate calculation result of an exponent bit may be output, and a mantissa intermediate calculation result of a mantissa bit (for example, an encoding process of a Booth algorithm and a compression process of a Wallace tree including the aforementioned input mantissa bit fixed-point multiplication) may be output. In the second phase: regularization and rounding operations may be performed on an exponent and a mantissa to output a calculation result of the exponent and a calculation result of the mantissa.

As shown in FIG. 8, the multiplier of the present disclosure may include a mode selection unit 802 and a normalization processing unit 804, where the mode selection unit may select a computation mode according to an input mode signal (in_mode). In an embodiment, the input mode signal may correspond to computation mode serial numbers in Table 2. For example, if the input mode signal indicates a computation mode serial number "1" in Table 2, the multiplier may work in a computation mode of FP16*FP16; however, if the input mode signal indicates a computation mode serial number "3" in Table 2, the multiplier may work in a computation mode of FP32*FP32. For a purpose of illustration, FIG. 8 only shows four exemplarily computation modes, including an FP16*FP16, a BF16*BF16, an FP32*FP32, and an FP32*BP16. However, as described earlier, the multiplier of the present disclosure similarly supports various other computation modes.

The normalization processing unit may be used to perform normalization processing on a first floating-point number or a second floating-point number according to a computation mode when the first floating-point number or the second floating-point number is a non-normalized and non-zero floating-point number, so as to obtain a corresponding exponent and a corresponding mantissa. For example, according to an IEEE754 standard, regularization processing may be performed on a floating-point number with a data format indicated by the computation mode.

Further, the multiplier may include a mantissa processing unit, which is used to perform a multiplication operation on a mantissa of the first floating-point number and a mantissa of the second floating-point number. Therefore, in one or more embodiments, the mantissa processing unit may include a bit number expansion circuit 806, a Booth encoder 808, a partial product generation circuit 810, a Wallace tree compressor 812, and an adder 814, where the bit number expansion circuit may be used to expand a mantissa in consideration of a non-normalized and non-zero number under the IEEE754 standard, so as to make the mantissa suitable for an operation of the Booth encoder. Since the Booth encoder, the partial product generation circuit, the Wallace tree compressor and the adder have been described in detail in combination with FIGS. 5 to 7, the same description is also applicable here and will not be repeated here.

In some embodiments, the multiplier of the present disclosure may further include a regularization unit 816 and a rounding unit 818. The regularization unit and the rounding unit have the same functions as units shown in FIG. 4. Specifically, for the regularization unit, the regularization unit may perform floating-point number regularization processing on a summation result and exponent data from an exponent processing unit according to a data format indicated by an output mode signal "out_mode" shown in FIG. 8, so as to obtain a regularized exponent result and a regularized mantissa result. For example, according to the data format indicated by the output mode signal, the regularization unit may adjust a bit width of an exponent and a bit width of a mantissa to make the exponent and the mantissa meet requirements of the data format indicated above. For another example, if the most significant bit of the mantissa is 0 and the mantissa is not 0, the regularization unit may shift the mantissa to the left by 1 bit repeatedly and make the exponent subtract 1 until the value of the most significant bit is 1. For the rounding unit, in an embodiment, the rounding unit may perform a rounding operation on the regularized mantissa result according to a rounding mode to obtain a mantissa after the rounding operation and take the mantissa after the rounding operation as a mantissa after the multiplication computation.

In one or more embodiments, the aforementioned output mode signal may be a part of the computation mode and used to indicate a data format after the multiplication computation. For example, as described in Table 3 above, when a computation mode serial number is "12", "1" thereof may be regarded as the "in_mode" signal described above, which is used to indicate that a multiplication operation of FP16*FP16 is performed, and "2" thereof may be regarded as the "out_mode" signal, which is used to indicate that a data type of an output result is BF16. Therefore, it may be understood that in some application scenarios, the output mode signal may be merged with the input mode signal described above to be provided to the mode selection unit. Based on a merged mode signal, the mode selection unit may determine data formats of both input data and output result in an initial phase of the operation of the multiplier, and the mode selection unit does not need to specially provide the output mode signal for regularization, thereby further simplifying the operation.

In one or more embodiments, for the aforementioned rounding operation, the following five rounding modes may be exemplarily included.

(1) Rounding to the closest value: in this mode, when two values are close to the closest value equally, an even number takes precedence. At this time, a result may be rounded to the nearest and representable value, but when two numbers are equally close to the value, the even number thereof may be taken as a rounding result (which is a number ending with 0 in binary).

(2) Rounding up and rounding down: exemplary operations may be presented with reference to the examples below.

(3) Rounding towards +∞: in this rule, the result may be rounded towards a positive infinity.

(4) Rounding towards −∞: in this rule, the result may be rounded towards a negative infinity.

(5) Rounding towards 0: in this rule, the result may be rounded towards 0.

For examples of mantissa rounding in the "rounding up and rounding down" mode: for example, when two 24-bit mantissas are multiplied to obtain a 48-bit (47-0) mantissa, after normalization processing, only 46th to 24th bits are used for output. When a 23th bit of the mantissa is 0, a (23-0) bit may be rounded off; when the 23th bit of the mantissa is 1, a 24th bit may carry 1 and the (23-0) bit may be rounded off.

Returning to FIG. 8, the multiplier of the present disclosure may further include an exponent processing unit 820 and a sign processing unit 822, where the exponent processing unit may be used to obtain an exponent after the multiplication computation according to a computation mode, an exponent of the first floating-point number, and an exponent of the second floating-point number. For example, the exponent processing circuit may sum exponent bit data of the first floating-point number and an offset of an input floating-point data type corresponding to the first floating-point number, and may sum exponent bit data of the second floating-point number and an offset of an input floating-point data type corresponding to the second floating-point number, and then may subtract offsets of output floating-point data types, so as to obtain exponent bit data of a multiplication product of the first floating-point number and the second floating-point number. In one or more embodiments, the exponent processing unit may be implemented as or include an addition and subtraction circuit (in other words, the exponent processing unit 820 may be implemented by an addition and subtraction circuit), and the exponent processing unit 820 may be used to obtain the exponent after the multiplication computation according to the computation mode, the exponent of the first floating-point number, and the exponent of the second floating-point number.

The sign processing unit 822, in an embodiment, may be implemented as an exclusive OR circuit (in other words, the sign processing unit 822 may be implemented in the form of the exclusive OR circuit). The sign processing unit 822 may be used to perform an exclusive OR operation on sign bit data of the first floating-point number and sign bit data of the second floating-point number to obtain sign bit data of a multiplication product of the first floating-point number and the second floating-point number.

The entire multiplier of the present disclosure has been described in detail above in combination with FIG. 8. Based on the above description, those skilled in the art may understand that the multiplier of the present disclosure supports operations in a plurality of computation modes, thereby overcoming the defect that existing technologies only support a multiplier for a single floating-point-type computation. Further, since the multiplier of the present disclosure may be reused, floating-point-type data with a high bit width may be supported, and computation costs and overheads may be reduced. In one or more embodiments, the multiplier of the present disclosure may be placed on or may be included in an integrated circuit chip or a computing apparatus, so as to perform a multiplication computation on floating-point numbers in the plurality of computation modes.

Figure 9:
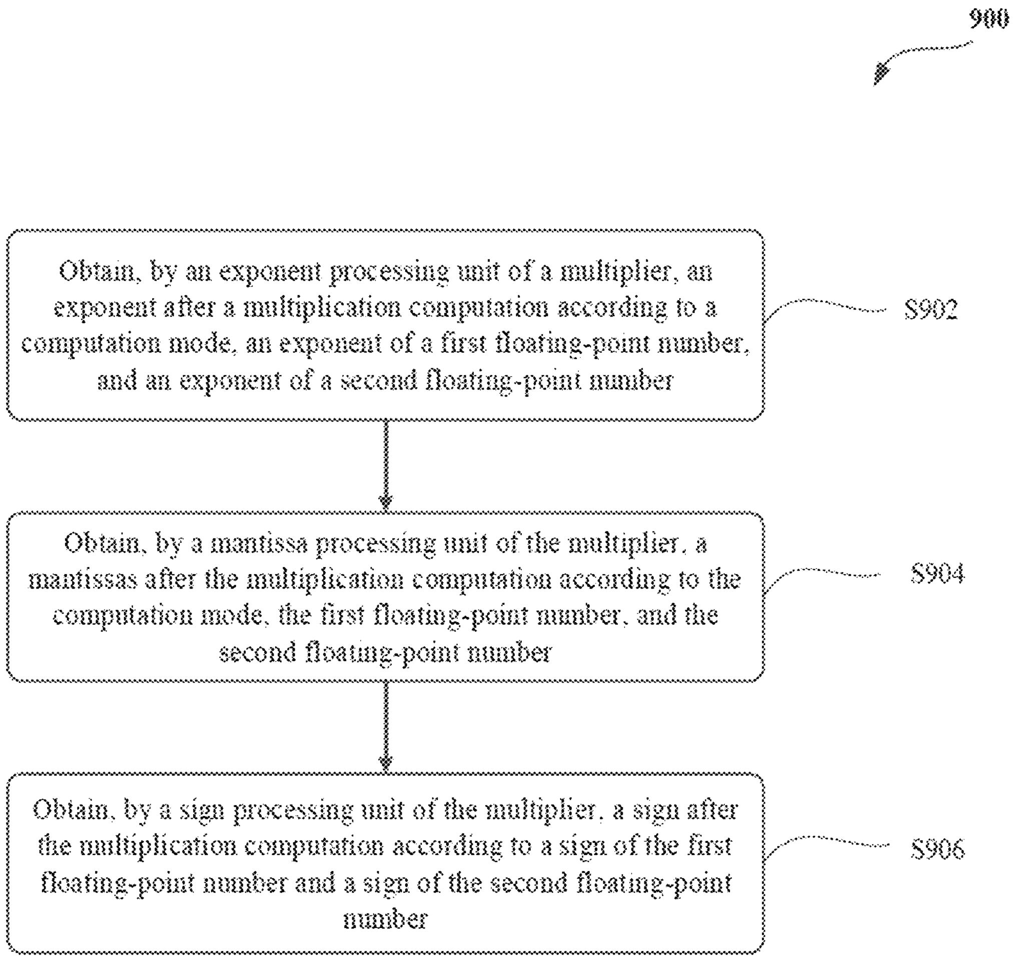
FIG. 9 is a flowchart of a method of using a multiplier to perform a floating-point number multiplication computation according to an embodiment of the present disclosure.

FIG. 9 is a flowchart of a method 900 of performing a floating-point number multiplication computation by a multiplier according to an embodiment of the present disclosure. It may be understood that here the multiplier is the multiplier that is described in detailed above in combination with FIGS. 2 to 8. Therefore, previous descriptions about the multiplier and its internal composition, functions, and operations are also applicable to the description here.

As shown in FIG. 9, the method 900 may include, in a step S902, obtaining, by an exponent processing unit of the multiplier, an exponent after a multiplication computation according to a computation mode, an exponent of a first floating-point number, and an exponent of a second floating-point number. As described earlier, the computation mode may be one of a plurality of computation modes, and the computation mode may be used to indicate a data format of a floating-point number. In one or more embodiments, the computation mode may further be used to determine a data format of a floating-point number of an output result.

Further, in a step S904, the method 900 may include obtaining, by a mantissa processing unit of the multiplier, a mantissas after the multiplication computation according to the computation mode, the first floating-point number, and the second floating-point number. Regarding exemplarily operations of a mantissa, the present disclosure uses a Booth encoding algorithm and a Wallace tree compressor in some preferred embodiments, thereby improving efficiency of mantissa processing. Additionally, when the first floating-point number and the second floating-point number are signed numbers, the method 900 may include, in a step S906, obtaining, by a sign processing unit of the multiplier, a sign after the multiplication computation according to a sign of the first floating-point number and a sign of the second floating-point number.

Although the above method shows using the multiplier of the present disclosure to perform a floating-point number multiplication computation in the form of steps, the order of these steps does not mean that the steps of the method must be executed in the stated order, but these steps may be executed in other orders or in parallel. Additionally, for the sake of concise description, other steps of the method 900 are not described here, but those skilled in the art may understand from the content of the present disclosure that the method may also use the multiplier to perform various operations described above in combination with FIGS. 2 to 8.

In the aforementioned embodiments of the present disclosure, the description of each embodiment has its own emphasis. A part that is not described in detail in one embodiment may be described with reference to related descriptions in other embodiments. Technical features of the aforementioned embodiments above may be randomly combined. For the sake of conciseness, not all possible combinations of the technical features of the aforementioned embodiments are described. Yet, provided that there is no contradiction, combinations of these technical features fall within the scope of the description of the present specification.

Figure 10:
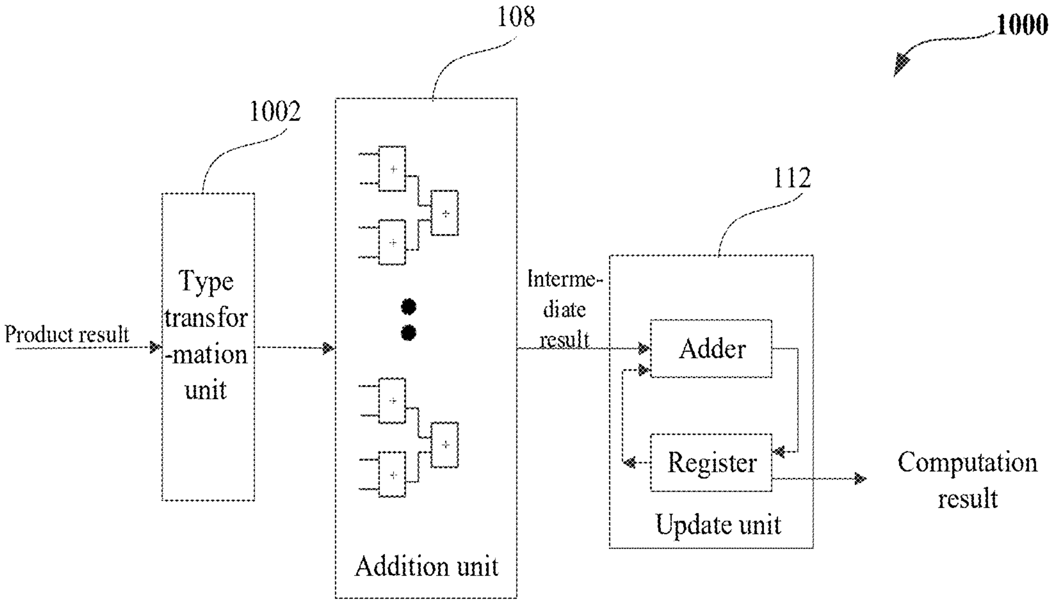
FIG. 10 is another schematic block diagram of a computing apparatus according to an embodiment of the present disclosure.

FIG. 10 is another schematic block diagram of a computing apparatus 1000 according to an embodiment of the present disclosure. From the content shown in figure, it may be shown that other than an added new first type transformation unit 1002, a computing apparatus 1000 may have the same composition, structure and functions and properties as the computing apparatus 100 described above in combination with FIG. 1 (for example, the addition unit 108 and the update unit 112), and therefore, the above description of the computing apparatus 100 may also be applicable to the computing apparatus 1000.

Regarding the added first type transformation unit, it may be applied to such a scenario where a first adder in an addition unit does not support a plurality of data types (or formats) and requires data type transformations. Therefore, in one or more embodiments, the added first type transformation unit may be configured to perform a data type (or data format) transformation on a product result, so that an adder performs an addition operation. Here, the product result may be a product result obtained by the aforementioned floating-point multiplier of the multiplication unit. In one or more embodiments, a data type of the product result may be, for example, one of the aforementioned FP16, BF16, FP32, UBF16, or UFP16. In this case, when a data type that is supported by a subsequent adder is different from the data type of the product result, a transformation of the data type may be performed by using the first type transformation unit, so as to make a result applicable to an addition operation of the adder. For example, when the product result is an FP16-type floating-point number and the adder supports an FP32-type floating-point number, the first type transformation unit may be configured to exemplarily perform the following operations on FP16-type data so as to transform the FP16-type data into FP32-type data: S1: shifting a sign bit to the left by 16 bits; S2: adding 112 (a difference between a cardinal number of the exponent, which is 127, and 15) to an exponent and shifting the exponent to the left by 13 bits (right alignment); S3: shifting a mantissa to the left by 13 bits (left alignment).

Based on the aforementioned examples, operations that are opposite may be performed to transform the FP32-type data into the FP16-type data, so that when the product result is the FP32-type data, the FP32-type data may be transformed into the FP16-type data to be applicable to the adder that supports the addition operation on the FP16-type data It may be understood that the operation of data type transformation here is only exemplary but not restrictive, and under the teaching of the present disclosure, those skilled in the art may select any suitable method or mechanism or operation to transform the data type of the product result into a data type that is compatible with the subsequent adder.

Figure 11:
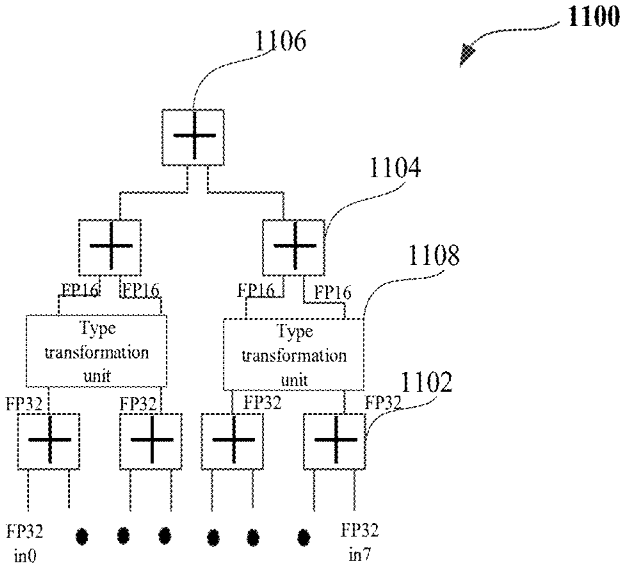
FIG. 11 is a schematic block diagram of an adder group according to an embodiment of the present disclosure.

FIG. 11 is a schematic block diagram of an adder group 1100 according to an embodiment of the present disclosure. From the schematic content shown in figure, it may be shown that the adder group is an adder group with a three-level tree structure, where a first level includes 4 first adders 1102, which exemplarily receive 8 FP32-type floating-point number inputs, such as in0, in1, . . . , and in7. A second level includes 2 first adders 1104, which exemplarily receive 4 FP16-type floating-point number inputs. A third level includes 1 first adder 1106, which exemplarily receives 2 FP16-type floating-point number inputs and outputs a summation result of the aforementioned 8 FP32-type floating-point numbers.

In an embodiment of the present disclosure, assuming that the 2 first adders 1104 in the second level do not support an addition operation of FP32-type floating-point numbers, therefore, the present disclosure sets one or more second type transformation units 1108 between first adders of the first level and first adders of the second level. In an embodiment, a second type transformation unit may have the same or similar functions as the first type transformation unit 1002 described in FIG. 10. In other words, the second type transformation unit is used to transform input floating-point-type data into a data type that is consistent with a subsequent addition operation. Specifically, the second type transformation unit may support one or a plurality of types of data type transformations according to different application needs. For example, in an example shown in FIG. 11, the second type transformation unit may support a unidirectional data type transformation from the FP32-type data to the FP16-type data. However, in other embodiments, the second type transformation unit may be designed to support a bidirectional data type transformation between the FP32-type data and the FP16-type data. In other words, the second type transformation unit may support not only a data type transformation from the FP32-type data to the FP16-type data, but also a data type transformation from the FP16-type data to the FP32-type data. Additionally or optionally, the first type transformation unit 1002 in FIG. 10 or the second type transformation unit 1108 in FIG. 11 may be configured to support a bidirectional data type transformation among a plurality of types of floating-point data. For example, the aforementioned bidirectional transformation between various types of floating-point data that is described in combination with a computation mode may be supported, which helps the present disclosure to maintain the forward or backward compatibility of data during a data processing process, and further expands application scenarios and scope of solutions of the present disclosure.

It needs to be emphasized that the aforementioned type transformation unit is only one optional solution of the present disclosure, and when a first adder or a second adder itself supports addition computations on a plurality of data formats, or when the first adder or the second adder is reused to process computations on the plurality of data formats, such a type transformation unit may not be needed. Additionally, when a data format that is supported by the second adder is a data format of output data of the first adder, it is also not necessary to set such a type transformation unit between the two adders.

Figure 12:
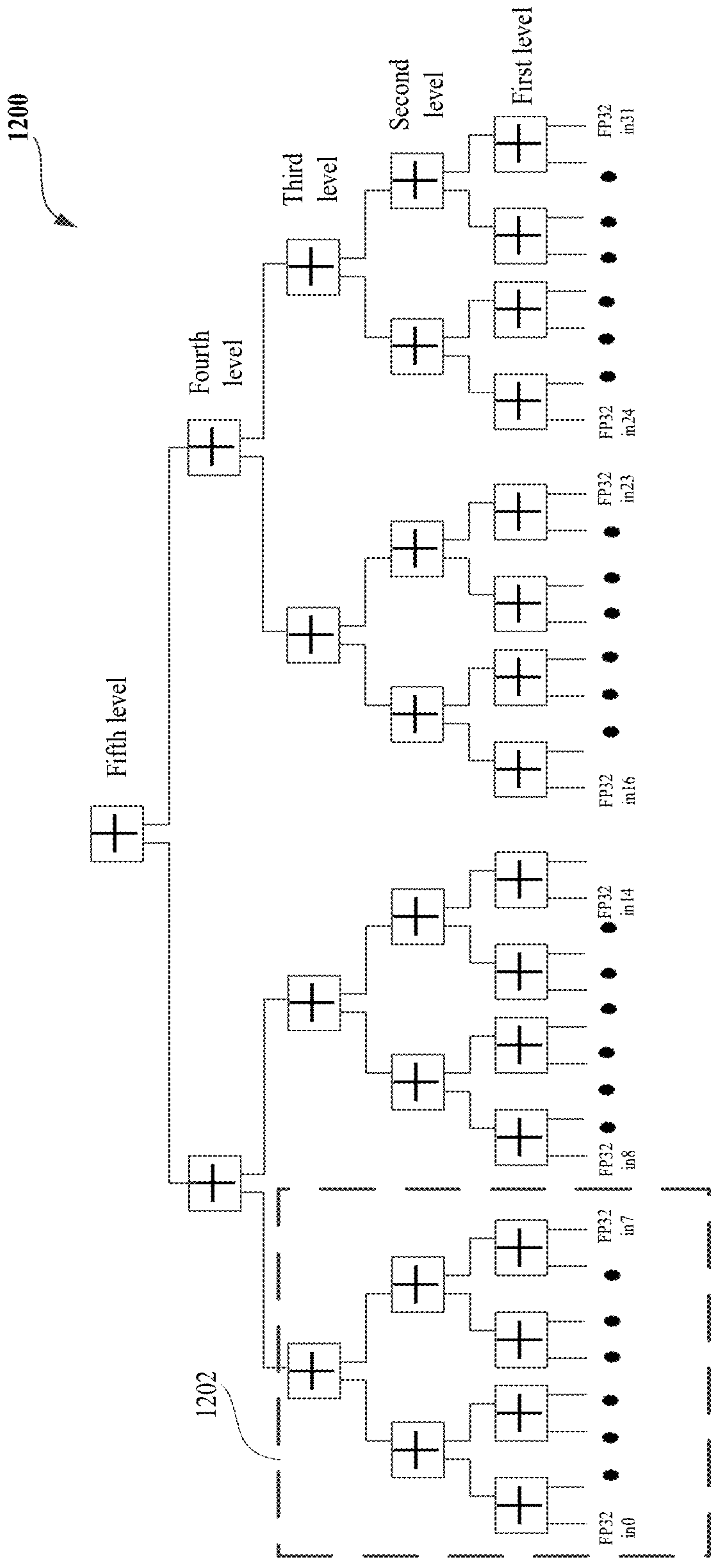
FIG. 12 is another schematic block diagram of an adder group according to an embodiment of the present disclosure.

FIG. 12 is a schematic block diagram of an adder group 1200 according to an embodiment of the present disclosure. From the content shown in figure, it may be shown that FIG. 12 exemplarily shows an adder group with a five-level tree structure, which specifically includes 16 adders in a first level, 8 adders in a second level, 4 adders in a third level, 2 adders in a fourth level, and 1 adder in a fifth level. From the multi-level tree structure, it may be shown that the adder group shown in FIG. 12 may be regarded as an expansion of the tree structure shown in FIG. 11. Or in other words, the adder group shown in FIG. 11 may be regarded as a part of or a constitutional unit of the adder group shown in FIG. 12, such as a part framed by a dashed line 1202 in FIG. 12.

In operations, the 16 adders in the first group may receive a product result from a multiplication unit. According to different application scenarios, the product result may be a floating-point number transformed by the first type transformation unit 1002 shown in FIG. 10. Optionally, when a data type supported by the aforementioned product result is the same with a data type supported by a first level adder of the adder group 1200, data may be directly input into the adder group 1200 without passing through the first type transformation unit, such as 32 FP32-type floating-point numbers shown in FIG. 12 (including in0-in31). After an addition operation of the 16 first adders in the first level, 16 summation results may be obtained as inputs of the 8 first adders in the second level. By analogy, summation results that are finally used as outputs of the 2 first adders in the fourth level may be input into the 1 first adder in the fifth level, and an output of the 1 first adder in the fifth level may be used as the aforementioned intermediate result to be input into the adder in the aforementioned update unit. According to different application scenarios, the intermediate result may go through one of the following operations.

When the intermediate result is an intermediate result obtained by invoking a multiplication unit in a first round, the intermediate result may be input into the adder in the aforementioned update unit and then cached in a register in the update unit to wait for performing an addition operation with an intermediate result obtained in a second round; or when the intermediate result is an intermediate result obtain in an intermediate round (for example, when more than two rounds of operations are performed), the intermediate result may be input into the adder in the update unit and then summed with a summation result obtained by a previous round of addition operation in the adder in the update unit that is input by the register, so as to be used as a summation result of the intermediate round of the addition operation to be stored in the register; or when the intermediate result is an intermediate result obtained by invoking the multiplication unit in a final round, the intermediate result may be input into the adder in the update unit and then summed with the summation result obtained by the previous round of addition operation in the adder that is input by the register, so as to be used as a final result of this neural network operation to be stored in the register.

Although in FIG. 12, a plurality of adders are placed in the form of a tree hierarchy to complete addition operations on a plurality of numbers, solutions of the present disclosure are not limited to this. Under the teaching of the present disclosure, those skilled in the art may place the plurality of adders in other suitable structures or methods, for example, through connecting a plurality of full adders, half adders or other types of adders serially or in parallel to implement addition operations on a plurality of input floating-point numbers. Additionally, for the sake of brevity, the second type transformation unit shown in FIG. 11 is not shown in an addition tree structure shown in FIG. 12. However, according to application needs, those skilled in the art may set one or more inter-stage second type transformation unit in the multi-level adder shown in FIG. 12 to implement transformations of data types among different levels and further expand the application scope of the computing apparatus of the present disclosure.

Figure 13:
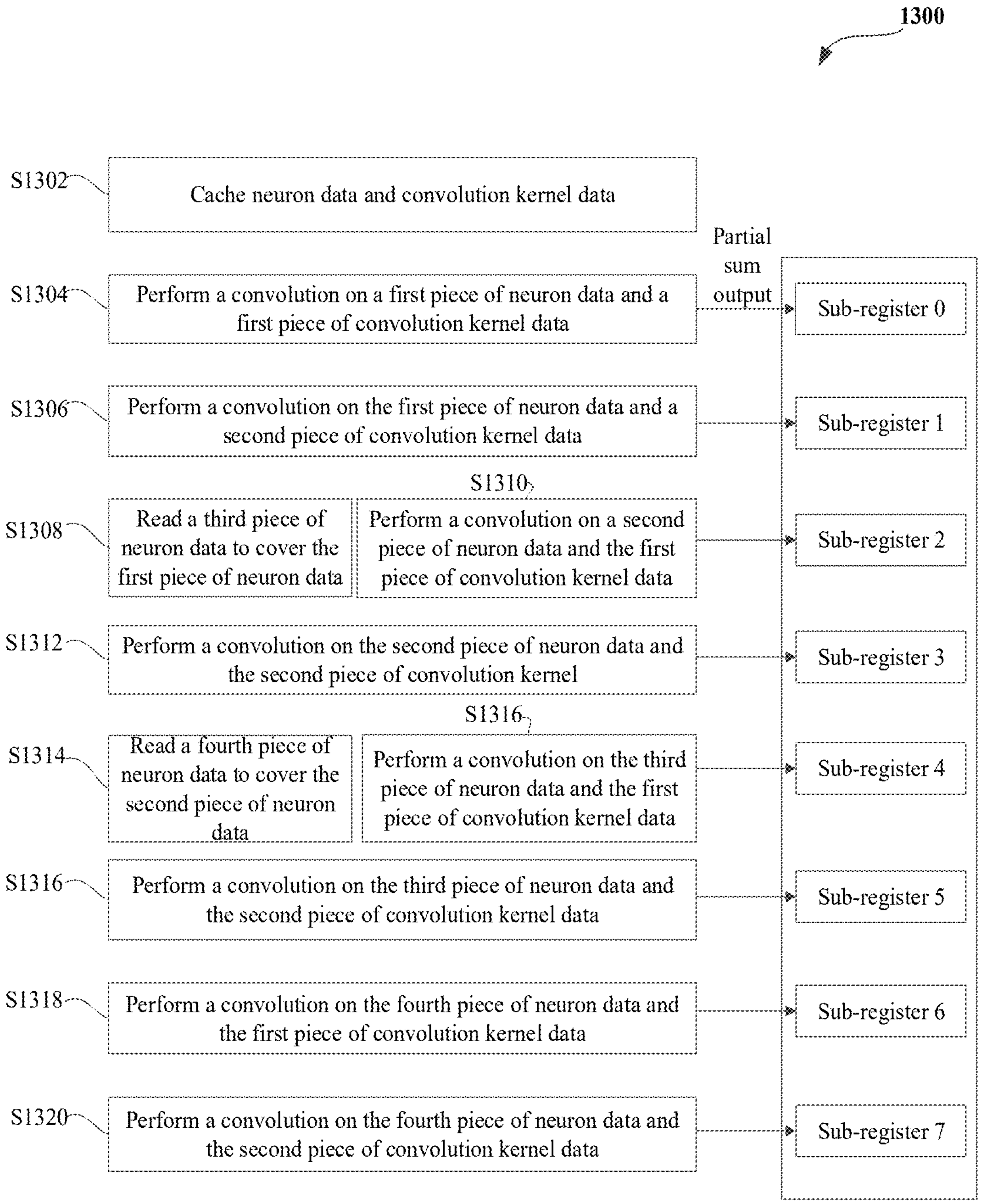
FIG. 13 is a flowchart of performing a neural network operation according to an embodiment of the present disclosure.
Figure 14:
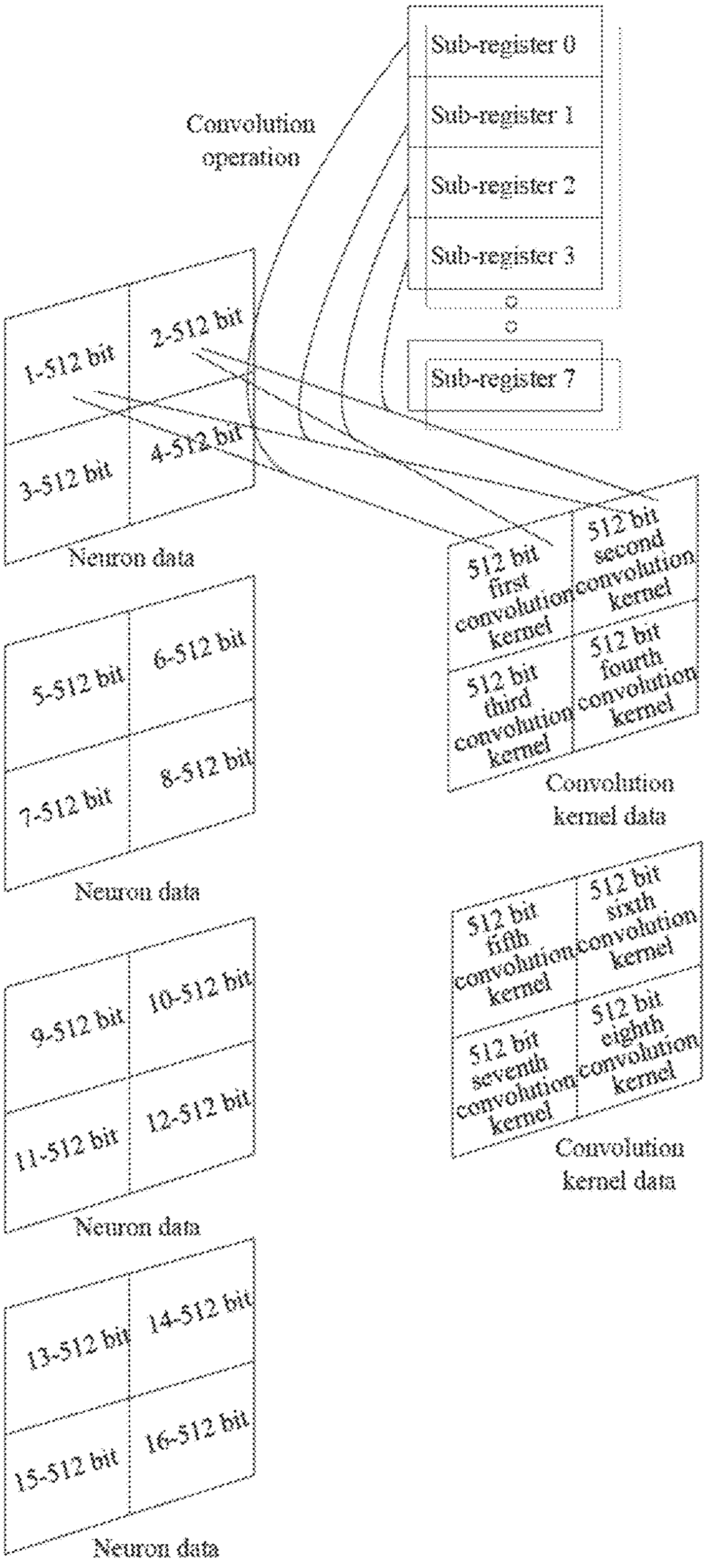
FIG. 14 is a schematic diagram of a neural network operation according to an embodiment of the present disclosure.

FIG. 13 and FIG. 14 show a flowchart and a schematic block diagram of a neural network operation 1300 respectively according to embodiments of the present disclosure. In order to better understand how the computing apparatus of the present disclosure performs a neural network operation, FIG. 13 and FIG. 14 take a convolution computation (including a convolution kernel that is used as one of weight data of the present disclosure, and neuron data) in a neural network as an example. It may be understood that the convolution computation may be operated in a plurality of layers in the neural network, such as a convolution layer and a fully-connected layer in the neural network.

In a process of calculating the convolution computation (such as an image convolution), the convolution kernel and the neuron data may be reused. Specifically, in the case of reusing the convolution kernel, a same convolution kernel may perform inner products with different pieces of neuron data in a process of sliding on a neuron data block. However, in the case of reusing the neuron data, different convolution kernels may perform inner products with a same neuron data block. Therefore, in order to avoid data to be moved and read repeatedly in the process of calculating the convolution and save power consumption, the computing apparatus of the present disclosure may reuse the neuron data and convolution kernel data in a computation process with a plurality of rounds.

According to the aforementioned reusing strategy, in one or more embodiments, an input terminal of the computing apparatus of the present disclosure may include at least two input ports that support a plurality of data bit widths, and the register in the update unit may include a plurality of sub-registers, so as to store intermediate results obtained in each round of operation. Based on this arrangement, the computing apparatus may be configured to respectively divide and reuse the neuron data and the weight data according to bit widths of the input ports, so as to perform neural network operations. For example, assuming that the two input ports of the computing apparatus of the present disclosure support an input of 512-bit-width data, and the neuron data and the convolution kernel are 2048-bit-width data, each convolution kernel and a corresponding neuron may be divided into 4 pieces of 512-bit-width vectors, and therefore, the computing apparatus may perform four rounds of computation to obtain a complete output result.

For a final output result, in one or more embodiments, the number of the final output result may be determined based on the number of times of reusing the neuron data and the number of times of reusing the convolution kernel. For example, the number may be obtained by calculating a multiplication product between the number of times of reusing the neuron data and the number of times of reusing the convolution kernel. Here, a maximum value of the number of times of reusing may be determined according to the number of registers (or sub-registers) in the update unit. For example, if the number of the sub-registers is n, and the current number of times of reusing the neuron data is m (where m is less than or equal to n), a maximum value of the number of times of reusing the convolution kernel is floor (n/m), where a floor function represents performing a round-down operation on n/m. For example, if the number of the sub-registers in the update unit is 8, and the current number of times of reusing the neuron data is 2, the maximum value of the number of times of reusing the convolution kernel is 4 (in other words, it is a floor (8/2)).

Based on the above discussion, the following, in combination with FIG. 13 and FIG. 14, will describe the operation of the computing apparatus of the present disclosure by taking 521-bit-width input ports, a 2048-bit-width BF16 convolution kernel, and 2048-bit-width BF16 neuron data as examples, where in consideration of bit widths of the input ports and the length of input data, it may be determined that a multiplication unit and an accumulation unit of the computing apparatus of the present disclosure are required to perform four rounds of consecutive operations, where the neuron data is reused twice, and the convolution kernel data is reused four times, and a final convolution result may be output after the update unit is updated in the fourth round of operation.

First, in a step S1302, the method 1300 may cache the neuron data and the convolution kernel data. For example, 2 pieces of 512-bit neuron data and 2 pieces of 512-bit convolution kernel data may be read and cached in a "buffer" or a register group. The 2 pieces of 512-bit neuron data may be neuron data "1-512 bit" and neuron data "2-512 bit" shown in a first block at the top left of FIG. 14, and the 2 pieces of 512-bit convolution kernel data may be "first convolution kernel" and "second convolution kernel" shown in a first block at the top right of FIG. 14.

Then, in a step S1304, the method 1300 may perform multiplication and accumulation operations on a first piece of 512-bit neuron and a first piece of 512-bit convolution kernel data and use a first partial sum obtained subsequently as a first intermediate result to be stored in a sub-register 0. For example, 512-bit neuron data and 512-bit convolution kernel data may be received through 2 input ports of the computing apparatus, and a multiplication operation between the 512-bit neuron data and the 512-bit convolution kernel data may be performed in the floating-point multiplier of the multiplication unit and then a result obtained may be input into an adder to perform an addition operation to obtain the intermediate result. Finally, the first intermediate result may be stored to a first sub-register of the update unit, which is the sub-register 0.

Similarly, in a step S1306, the method 1300 may perform multiplication and accumulation operations on the first piece of 512-bit neuron and a second piece of 512-bit convolution kernel data, and then use a second partial sum obtained as a second intermediate result to be stored to a sub-register 1, as shown in FIG. 14. Since in this embodiment, the convolution kernel is reused twice, and each corresponding neuron participates in the calculation twice, therefore, a computation of a first piece of 512-bit neuron data is completed.

Then, in a step S1308, the method 1300 may read a third piece of 512-bit neuron data to cover the first piece of 512-bit neuron data. Simultaneously, in a step S1310, the method 1300 may perform multiplication and accumulation operations on a second piece of 512-bit neuron data and the first piece of 512-bit convolution kernel data, and then use a third partial sum obtained as a third intermediate result to be stored to a sub-register 2. Then, in a step S1310, the method 1300 may perform multiplication and accumulation operations on the second piece of 512-bit neuron data and the second piece of 512-bit convolution kernel data, and then use a fourth partial sum obtained as a fourth intermediate result to be stored to a sub-register 3. Similarly, since the neuron data is only reused twice, therefore, at this time, the second piece of 512-bit neuron data is reused, and in a step S1312, the method 1300 may read a fourth piece of 512-bit neuron to cover the second piece of 512-bit neuron data.

Similar to the above-mentioned steps, in a step S1314, the method 1300 may perform convolution operations (which are multiplication and accumulation operations) on the third piece of 512-bit neuron data and the first piece of 512-bit convolution kernel data, and then use a fifth partial sum obtained as a fifth intermediate result to be stored to a sub-register 4. In a step S1316, the method 1300 may perform convolution operations on the third piece of 512-bit neuron data and the second piece of 512-bit convolution kernel data, and then use a sixth partial sum obtained as a sixth intermediate result to be stored to a sub-register 5. In a step 1318, the method 1300 may perform convolution operations on the fourth piece of 512-bit neuron data and the first piece of 512-bit convolution kernel data, and then use a seventh partial sum obtained as a seventh intermediate result to be stored to a sub-register 6. Finally, in a step 1320, the method 1300 may perform convolution operations on the fourth piece of 512-bit neuron data and the second piece of 512-bit convolution kernel data, and then use an eighth partial sum obtained as an eighth intermediate result to be stored to a sub-register 7.

Through exemplary operations of the above-mentioned steps S1302-S1320, the method 1300 completes a first round of reusing operation of the neuron data and the convolution kernel data. As mentioned earlier, since both a size of the neuron and a size of the convolution kernel are 2048 bits, which means that each convolution kernel and each piece of corresponding neuron data are 4 pieces of 512-bit vectors, therefore, to obtain a complete output, the update unit is require to be updated four times, which means that the computing apparatus is required to perform a total of 4 rounds of computations. Based on this, in a second round of operation, operations similar to the steps S1202-S1220 may be performed on a second neuron data block (which are four pieces of neuron data including 5-512 bit, 6-512 bit, 7-512 bit, and 8-512 bit) in a left side of FIGS. 14 and "512-bit third convolution kernel" and "512-bit fourth convolution kernel" in a right side, and intermediate results obtained may be respectively updated in the sub-register 0 to the sub-register 7 through the update unit. At this time, the summation results are stored in the sub-register 0 to the sub-register 7; in other words, summation results obtained after an addition operation is performed on the stored intermediate result of the first round and the intermediate result obtained in the second round are stored in the sub-register 0 to the sub-register 7. For example, a summation result of the first intermediate result in the first round of operation and the second intermediate result in the second round of operation may be stored in the sub-register 0.

Similar to the above-mentioned first round of operation and the second round of operation, the computing apparatus of the present disclosure may continue to perform a third round of operation and a fourth round of operation. Specifically, in the third round of operation, the computing apparatus may complete convolution operations and updating operations on a third neuron data block (which are four pieces of neuron data including 9-512 bit, 10-512 bit, 11-512 bit and 12-512 bit) in the left side of FIGS. 14, and "512-bit fifth convolution kernel" and "512-bit sixth convolution kernel" in the right side. Specifically, 8 intermediate results obtained in the third round may be respectively updated in the sub-register 0 to the sub-register 7 through the update unit, so as to be respectively summed with the summation result obtained after the second round, so as to obtain a summation result obtained after the third round and respectively stored in the sub-register 0 to the sub-register 7.

Further, in a final (fourth) round of operation, the computing apparatus may complete convolution operations and updating operations on a fourth neuron data block (which are four pieces of neuron data including 13-512 bit, 14-512 bit, 15-512 bit and 16-512 bit) in the left side of FIGS. 14, and "512-bit seventh convolution kernel" and "512-bit eighth convolution kernel" in the right side. Specifically, 8 intermediate results obtained in the fourth round may be respectively updated in the sub-register 0 to the sub-register 7 through the update unit, so as to be respectively summed with the summation result obtained after the third round to obtain a summation result after the fourth round of operation. At this time, the summation results are final complete 8 calculation results of this example, and the summation results may be respectively output through the sub-register 0 to the sub-register 7.

Through example, the above describes how the computing apparatus of the present disclosure completes neural network operations by reusing the convolution kernel and the neuron data. It needs to be understood that the above-mentioned examples are only exemplary and never restrict the solutions of the present disclosure in any sense. Under the teaching of the present disclosure, those skilled in the art may modify reusing solutions, for example, by setting a different count of sub-registers, and by selecting input ports that support different bit widths.

Figure 15:
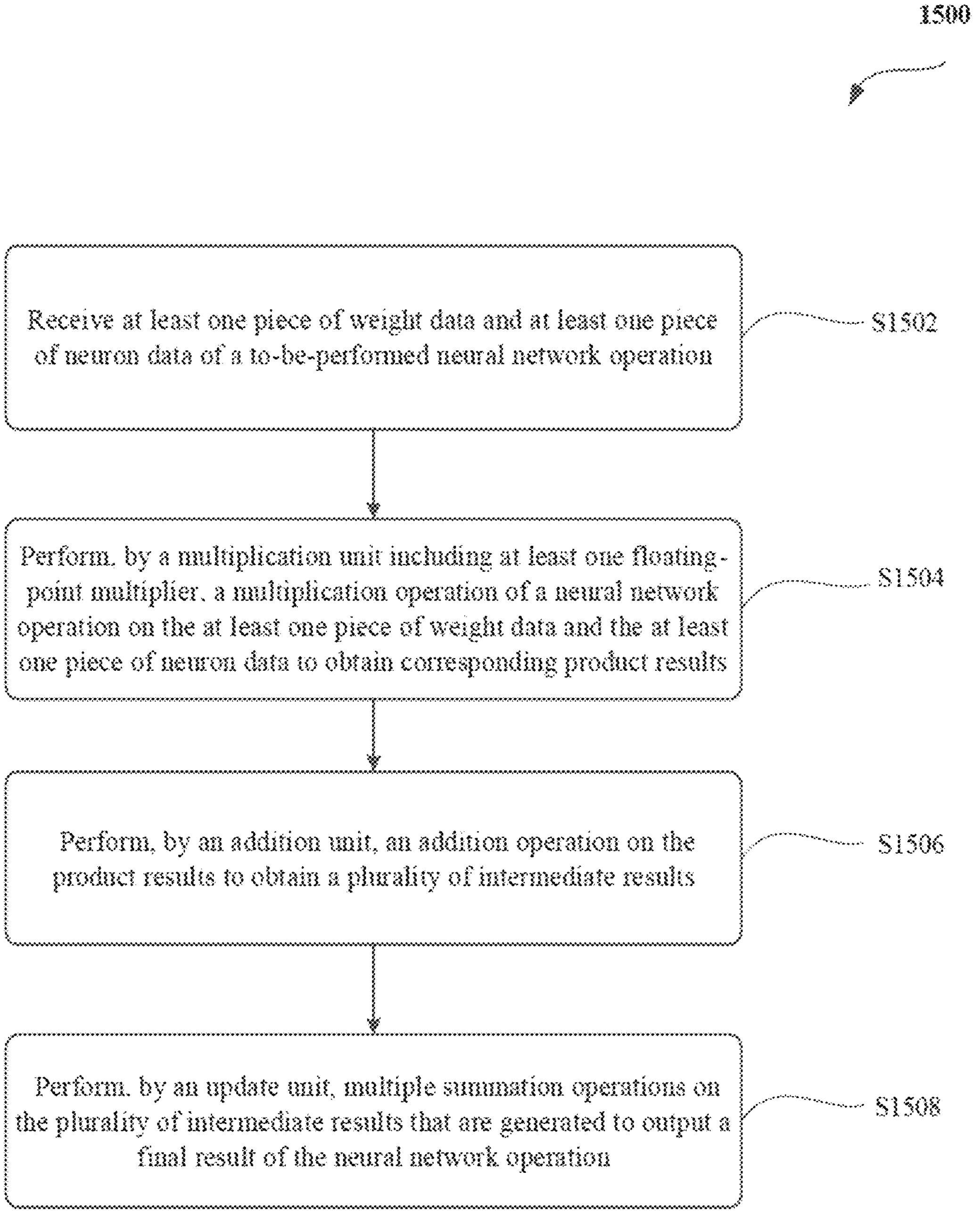
FIG. 15 is a flowchart of using a computing apparatus to perform a neural network operation according to an embodiment of the present disclosure.

FIG. 15 is a flowchart of a method 1500 of performing a neural network operation by a computing apparatus according to an embodiment of the present disclosure. It may be understood that the computing apparatus here is the computing apparatus that is described above in combination with FIGS. 1 to 14, including the floating-point multiplier described in detail above. Therefore, previous descriptions about the computing apparatus, the floating-point multiplier and its internal composition, functions, and operations are also applicable to the description here.

As shown in FIG. 15, the method 1500 may include, in a step S1502, receiving at least one piece of weight data and at least one piece of neuron data of a to-be-performed neural network operation. As mentioned earlier, the at least one piece of weight data and the at least one piece of neuron data may have a data format of a floating-point number. In one or more embodiments, the at least one piece of weight data and the at least one piece of neuron data may have a data format that is indicated by the aforementioned computation mode. For example, the computation mode may use a first level or a second level to indicate floating-point number data formats of the weight data and the neuron data.

Then, in a step S1504, the method 1500 may perform, by a multiplication unit including at least one floating-point multiplier, a multiplication operation of the neural network operation on the at least one piece of weight data and the at least one piece of neuron data to obtain corresponding product results. As mentioned earlier, the floating-point multiplier here may be the floating-point multiplier described above in combination with FIGS. 2 to 9. The floating-point multiplier supports a plurality of types of computation mode and reuse, so as to perform multiplication operations on floating-point input data with different data formats to further obtain product results of the weight data and the neuron data.

After the product results are obtained, in a step S1506, the method 1500 may perform, by an addition unit, an addition operation on the product results to obtain a plurality of intermediate result. As mentioned earlier, the addition unit may be implemented through adders such as a plurality of full adders, half adders, ripple-carry adders, and carry-lookahead adders, and the addition unit may be connected in various suitable forms. For example, the addition unit may be implemented through array adders and the multi-level tree structure shown in FIG. 11 and FIG. 12.

In a step S1508, the method 1500 may perform, by an update unit, multiple summation operations on the plurality of intermediate results that are generated to output a final result of the neural network operation. As mentioned earlier, in one or more embodiments, the update unit may include a second adder and a register, where the second adder may be configured to perform the following operations repeatedly until summation operations of all intermediate results are completed: receiving the intermediate result from an adder and a previous summation result from the register and a previous summation operation; summing the intermediate result and a previous summation result to obtain a summation result of a present summation operation; and by using the summation result of the present summation operation, updating a previous summation result that is stored in the register. Through operations of the update unit, the computing apparatus of the present disclosure may invoke the multiplication unit multiple times to realize the support of neural network operations with large amounts of data.

Although the above method shows the use of the computing apparatus of the present disclosure to perform neural network operations including the floating-point number multiplication operation and the addition operation in the form of steps, the order of these steps does not mean that the steps of the method must be executed in the stated order, but these steps may be executed in other orders or in parallel. Additionally, for the sake of concise description, other steps of the method 1500 are not described here, but those skilled in the art may understand from the content of the present disclosure that the method, by using the multiplier, may perform various operations described in combination with drawings.

Figure 16:
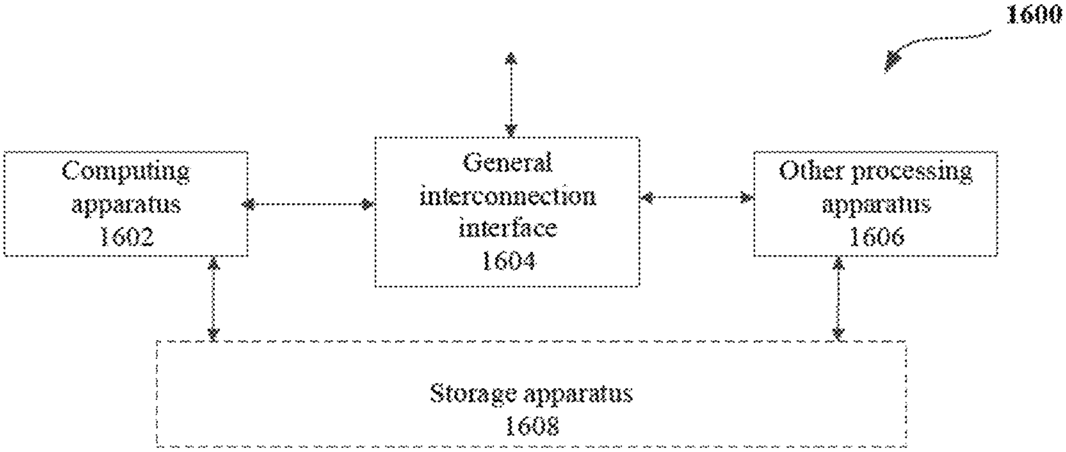
FIG. 16 is a structural diagram of a combined processing apparatus according to an embodiment of the present disclosure.

FIG. 16 is a structural diagram of a combined processing apparatus 1600 according to an embodiment of the present disclosure. As shown in figure, the combined processing apparatus 1600 may include the computing apparatus described above in combination with FIGS. 1 to 15, such as a computing apparatus 1602 shown in the figure. Additionally, the combined processing apparatus may further include a general interconnection interface 1604 and other processing apparatus 1606. The computing apparatus of the present disclosure interacts with other processing apparatus to jointly complete operations specified by users.

According to solutions of the present disclosure, other processing apparatuses may include one or more of general-purpose and/or special-purpose processors such as a central processing unit (CPU), a graphics processing unit (GPU), an artificial intelligence processor, and the like, whose number is not limited and is determined according to actual needs. In one or more embodiments, other processing apparatuses may serve as an interface that connects the computing apparatus (which may be embodied as an artificial intelligence computing apparatus) of the present disclosure to external data and control and perform operations that include but are not limited to data moving, and complete basic controls such as starting and stopping a machine learning computation apparatus. Other processing apparatus may also cooperate with the machine learning computation apparatus to complete computation tasks.

According to the solutions of the present disclosure, the general interconnection interface may be used to transfer data and control instructions between the computing apparatus and other processing apparatus. For example, the computing apparatus may obtain required input data from other processing apparatus via the general interconnection interface and write the input data to an on-chip storage apparatus of the computing apparatus. Further, the computing apparatus may obtain the control instructions from other processing apparatus via the general interconnection interface and write the control instructions to an on-chip control caching unit of the computing apparatus. Alternatively or optionally, the general interconnection interface may further read data in the storage unit of the computing apparatus and then transfer the data to other processing apparatus.

Optionally, the combined processing apparatus may further include a storage apparatus 1608, which may be respectively connected to the computing apparatus and other processing apparatus. In one or more embodiments, the storage apparatus may be used to store data of the computing apparatus and other processing apparatus, especially to-be-computed data that may not be entirely stored in an internal memory of the computing apparatus or other processing apparatuses.

According to different application scenarios, the combined processing apparatus may be used as a system on chip (SOC) of a device including a mobile phone, a robot, a drone, a video-capture device, a video surveillance device, and the like, which may effectively reduce a core area of a control part, increase processing speed, and reduce overall power consumption. In this case, the general interconnection interface of the combined processing apparatus may be connected to some components of the device. The components here may include a camera, a monitor, a mouse, a keyboard, a network card, and a WIFI interface.

In some embodiments, the present disclosure provides a chip (or called an integrated circuit chip), which includes the above-mentioned computing apparatus or the above-mentioned combined processing apparatus. In other embodiments, the present disclosure provides a chip package structure, which includes the chip above.

In some embodiments, the present disclosure provides a board card, which includes the chip package structure above. Referring to FIG. 17, FIG. 17 shows the aforementioned exemplary board card. Other than the aforementioned chip 1702, the aforementioned board card may further include other supporting components, where the supporting components include but are not limited to: a storage component 1704, an interface apparatus 1706, and a control component 1708.

The storage component may be connected to the chip in the chip package structure through a bus and may be used for storing data. The storage component may include a plurality of groups of storage units 1710. Each group of storage units may be connected to the chip through the bus. It may be understood that each group of storage units may be a double data rate (DDR) synchronous dynamic random access memory (SDRAM).

The DDR may double the speed of the SDRAM without increasing clock frequency. The DDR allows data to be read on rising and falling edges of a clock pulse. The speed of the DDR is twice that of a standard SDRAM. In an embodiment, the storage component may include 4 groups of storage units. Each group of storage units may include a plurality of DDR4 particles (chips). In an example, four 72-bit DDR4 controllers may be arranged inside the chip, where 64 bits of each 72-bit DDR4 controller are used for data transfer, and 8 bits are used for an error checking and correcting (ECC) parity.

In an embodiment, each group of storage units may include a plurality of DDR SDRAMs arranged in parallel. The DDR may transfer data twice per clock cycle. A controller for controlling the DDR is arranged in the chip to control data transfer and data storage of each storage unit.

The interface apparatus may be electrically connected to the chip in the chip package structure. The interface apparatus may be configured to implement data transfer between the chip and an external device 1712 (such as a server or a computer). In an embodiment, the interface apparatus may be a standard peripheral component interconnect express (PCIe) interface. For example, to-be-processed data is transferred from the server to the chip through a standard PCIe interface to realize data transfer. In another embodiment, the interface apparatus may also be other interfaces. Specific representations of other interfaces are not limited in the present disclosure, as long as an interface unit may realize a switching function. Additionally, a computing result of the chip is still sent back to the external device (such as the server) by the interface apparatus.

The control component is electrically connected to the chip, so as to monitor a state of the chip. Specifically, the chip and the control component may be electrically connected through a serial peripheral interface (SPI). The control component may include a micro controller unit (MCU). The chip may include a plurality of processing chips, a plurality of processing cores, or a plurality of processing circuits, and may drive a plurality of loads. Therefore, the chip may be in different working states such as a multi-load state and a light-load state. Through the control apparatus, regulation and control of working states of the plurality of processing chips, the plurality of processing cores and/or the plurality of processing circuits in the chip may be realized.

In some embodiments, the present disclosure provides an electronic device or apparatus, which includes the aforementioned board card. According to different application scenarios, the electronic device or apparatus may include a data processing apparatus, a robot, a computer, a printer, a scanner, a tablet, a smart terminal, a mobile phone, a traffic recorder, a navigator, a sensor, a webcam, a server, a cloud-based server, a camera, a video camera, a projector, a watch, a headphone, a mobile storage, a wearable device, a vehicle, a household appliance, and/or a medical device. The vehicle may include an airplane, a ship, and/or a car; the household appliance may include a television, an air conditioner, a microwave oven, a refrigerator, an electric rice cooker, a humidifier, a washing machine, an electric lamp, a gas cooker, and a range hood; and the medical device may include a nuclear magnetic resonance spectrometer, a B-ultrasonic scanner, and/or an electrocardiograph.

The foregoing may be better understood according to the following articles.

Article A1. A computing apparatus for performing a neural network operation, comprising: an input terminal configured to receive at least one piece of weight data and at least one piece of neuron data of a to-be-performed neural network operation; a multiplication unit, including at least one floating-point multiplier, where the floating-point multiplier is configured to perform a multiplication operation of the neural network operation on the at least one piece of weight data and the at least one piece of neuron data to obtain corresponding product results; an addition unit configured to perform an addition operation on the product results to obtain a plurality of intermediate results; and an update unit configured to perform multiple summation operations on the plurality of intermediate results that are generated to output a final result of the neural network operation.

Article A2. The computing apparatus of article A1, where the at least one piece of weight data and the at least one piece of neuron data are data with the same or different data types.

Article A3. The computing apparatus of article A1 or A2, further comprising: a first type transformation unit configured to perform data type transformations on the product results to enable the addition unit to perform the addition operation.

Article A4. The computing apparatus of any one of articles A1-A3, where the addition unit includes a multi-level adder group arranged in a multi-level tree structure, where each level of the adder group includes one or more first adders.

Article A5. The computing apparatus of any one of articles A1-A4, further comprising: one or more second type transformation units placed on the multi-level adder group, which are configured to transform data output by one level of the adder group into another type of data for an addition operation of a next level of the adder group.

Article A6. The computing apparatus of any one of articles A1-A5, where after outputting a product result, the multiplication unit receives a next pair of the at least one piece of weight data and the at least one piece of neuron data for the multiplication operation, and after outputting an intermediate result, the addition unit receives a next product result from the multiplication unit for the addition operation.

Article A7. The computing apparatus of any one of articles A1-A6, where the update unit includes a second adder and a register, where the second adder is configured to perform the following operations repeatedly until summation operations on all the plurality of intermediate results are completed: receiving an intermediate result from the addition unit and a previous summation result from the register and a previous summation operation; summing the intermediate result and the previous summation result to obtain a summation result of a present summation operation; and by using the summation result of the present summation operation, updating a previous summation result that is stored in the register.

Article A8. The computing apparatus of any one of articles A1-A7, where the input terminal includes at least two input ports that support a plurality of data bit widths, and the register includes a plurality of sub-registers, and the computing apparatus is configured to: according to bit widths of the input ports, respectively divide and reuse the neuron data and the weight data to perform the neural network operation.

Article A9. The computing apparatus of any one of articles A1-A8, where the multiplier, the addition unit, and the update unit are configured to perform a plurality of rounds of operations according to a division and a reuse, where in each round of operation, an obtained intermediate result is stored in a corresponding sub-register, and an update of a sub-register is performed by the update unit; and in a final round of operation, the final result of the neural network operation is output by the plurality of sub-registers.

Article A10. The computing apparatus of any one of articles A1-A9, where the number of result items of the final result is based on the number of times of reusing the neuron data and the number of times of reusing the weight data.

Article A11. The computing apparatus of any one of articles A1-A10, where a maximum value of the number of times of reusing is based on the number of the plurality of sub-registers.

Article A12. The computing apparatus of any one of articles A1-A11, where the computing apparatus includes n sub-registers, and the number of times of reusing the neuron data is m, and the maximum number of times of reusing the weight data is floor(n/m), where m is equal to or less than n, and a floor function represents performing a round-down operation on n/m.

Article A13. The computing apparatus of any one of articles A1-A12, where the floating-point multiplier is used to perform a multiplication computation on the at least one piece of neuron data and the at least one piece of weight data according to a computation mode, where the at least one piece of neuron data and the at least one piece of weight data at least include respective exponents and respective mantissas, and the floating-point multiplier includes: an exponent processing unit configured to obtain an exponent after the multiplication computation according to the computation mode, an exponent of the at least one piece of neuron data, and an exponent of the at least one piece of weight data; and a mantissa processing unit configured to obtain a mantissa after the multiplication computation according to the computation mode, the at least one piece of neuron data, and the at least one piece of weight data, where the computation mode is used to indicate a data format of the at least one piece of neuron data and a data format of the at least one piece of weight data.

Article A14. The computing apparatus of article A13, where the computation mode is further used to indicate a data format after the multiplication computation.

Article A15. The computing apparatus of any one of articles A12-A14, where a data format include at least one of a half precision floating-point number, a single precision floating-point number, a brain floating-point number, a double precision floating-point number, and a self definition floating-point number.

Article A16. The computing apparatus of any one of articles A12-A15, where the at least one piece of neuron data and the at least one piece of weight data further include respective signs, and the floating-point multiplier further includes: a sign processing unit configured to obtain a sign after the multiplication computation according to a sign of the at least one piece of neuron data and a sign of the at least one piece of weight data.

Article A17. The computing apparatus of any one of articles A12-A16, where a sign processing unit includes an exclusive OR logic circuit, where the exclusive OR logic circuit is configured to perform an exclusive OR computation according to the sign of the at least one piece of neuron data and the sign of the at least one piece of weight data to obtain the sign after the multiplication computation.

Article A18. The computing apparatus of any one of articles A12-A17, further comprising: a normalization processing unit configured to perform normalization processing on the at least one piece of neuron data or the at least one piece of weight data according to the computation mode when the at least one piece of neuron data or the at least one piece of weight data is a non-normalized and non-zero floating-point number, so as to obtain a corresponding exponent and a corresponding mantissa.

Article A19. The computing apparatus of any one of articles A12-A18, where the mantissa processing unit includes a partial product computation unit and a partial product summation unit, where the partial product computation unit is configured to obtain mantissa intermediate results according to the mantissa of the at least one piece of neuron data and the mantissa of the at least one piece of weight data, and the partial product summation unit is configured to perform a summation computation on the mantissa intermediate results to obtain a summation result and take the summation result as the mantissa after the multiplication computation.

Article A20. The computing apparatus of any one of articles A12-A19, where the partial product computation unit includes a Booth encoding circuit, where the Booth encoding circuit is configured to fill high and low bits of the mantissa of the at least one piece of weight data with 0 and perform Booth encoding processing, so as to obtain the mantissa intermediate results.

Article A21. The computing apparatus of any one of articles A12-A20, where the partial product summation unit includes an adder, where the adder is configured to sum the mantissa intermediate results to obtain the summation result.

Article A22. The computing apparatus of any one of articles A12-A21, where the partial product summation unit includes a Wallace tree and the adder, where the Wallace tree is configured to sum the mantissa intermediate results to obtain second mantissa intermediate results, and the adder in the partial product summation unit is configured to sum the second mantissa intermediate results to obtain the summation result.

Article A23. The computing apparatus of any one of articles A12-A22, where the adder in the partial product summation unit includes at least one of a full adder, a serial adder, and a carry-lookahead adder.

Article A24. The computing apparatus of any one of articles A12-A23, where when the number of the mantissa intermediate results is less than M, a zero is added to be used as a mantissa intermediate result, so as to make the number of the mantissa intermediate results equal to M, where M is a preset positive integer.

Article A25. The computing apparatus of any one of articles A12-A24, where each Wallace tree has M inputs and N outputs, and the number of Wallace trees is not less than N*K, where N is a preset positive integer that is less than M, and K is a positive integer that is not less than the biggest bit width of the mantissa intermediate results.

Article A26. The computing apparatus of any one of articles A12-A25, where the partial product summation unit is configured to select N groups of Wallace trees to sum the intermediate results according to the computation mode, where each group has X Wallace trees, and X is the bit number of the mantissa intermediate results, where there is a sequential carry relationship between Wallace trees within each group, but there is no carry relationship between Wallace trees between each group.

Article A27. The computing apparatus of any one of articles A12-A26, where the mantissa processing unit further includes a control circuit configured to invoke the mantissa processing unit multiple times according to the computation mode when the computation mode indicates that a mantissa bit width of at least one of the at least one piece of neuron data or the at least one piece of weight data is greater than a data bit width that is processable by the mantissa processing unit at one time.

Article A28. The computing apparatus of any one of articles A12-A27, where the partial product summation unit further includes a shifter, where, when the control circuit invokes the mantissa processing unit multiple times according to the computation mode, in each invocation, the shifter is configured to shift an existing summation result and add a shifted summation result to a summation result obtained in a current invocation to obtain a new summation result and take a new summation result obtained in a final invocation as the mantissa after the multiplication computation.

Article A29. The computing apparatus of any one of articles A12-A28, where the floating-point multiplier further includes a regularization unit configured to: perform floating-point number regularization processing on the mantissa after the multiplication computation and the exponent after the multiplication computation to obtain a regularized exponent result and a regularized mantissa result and take the regularized exponent result as the exponent after the multiplication computation and take the regularized mantissa result as the mantissa after the multiplication computation.

Article A30. The computing apparatus of any one of articles A12-A29, where the floating-point multiplier further includes: a rounding unit configured to perform a rounding operation on the regularized mantissa result according to a rounding mode to obtain a mantissa after rounding and take the mantissa after rounding as the mantissa after the multiplication computation.

Article A31. The computing apparatus of any one of articles A12-A30, further comprising: a mode selection unit configured to select a computation mode that indicates the data format of the at least one piece of neuron data and the data format of the at least one piece of weight data from a plurality of types of computation modes that are supported by the floating-point multiplier.

Article 32. A method for performing a neural network operation, comprising: receiving, by an input terminal, at least one piece of weight data and at least one piece of neuron data of a to-be-performed neural network operation; performing, by a multiplication unit including at least one floating-point multiplier, a multiplication operation of the neural network operation on the at least one piece of weight data and the at least one piece of neuron data to obtain corresponding product results; performing, by an addition unit, an addition operation on the product results to obtain a plurality of intermediate results; and performing, by an update unit, multiple summation operations on the plurality of intermediate results that are generated, so as to output a final result of the neural network operation.

Article A33. An integrated circuit chip, including the computing apparatus of any one of articles A1-A31.

Article A34. An integrated circuit device, including the computing apparatus of any one of articles A1-A31.

It is required to be noted that for the sake of conciseness, the foregoing method embodiments are all described as a series of combinations of actions, but those skilled in the art should know that the present disclosure is not limited by the described order of action since steps may be performed in a different order or simultaneously according to the present disclosure. Moreover, those skilled in the art should also understand that embodiments described in the specification are all optional, and actions and modules involved are not necessarily required for the present disclosure.

In the embodiments above, the description of each embodiment has its own emphasis. For a part that is not described in detail in one embodiment, reference may be made to related descriptions in other embodiments.

In several embodiments provided in the present disclosure, it should be understood that the disclosed apparatus may be implemented in other ways. For instance, the apparatus embodiments above are merely illustrative. For instance, a division of units is only a logical function division. In an actual implementation, there may be other manners for the division. For instance, a plurality of units or components may be combined or may be integrated in another system, or some features may be ignored or may not be performed. In addition, the displayed or discussed mutual coupling or direct coupling or communication connection may be implemented through an indirect coupling or a communication connection of some interfaces, devices or units, and may be in electrical, optical, acoustic, magnetic or other forms.

The units described as separate components may or may not be physically separated. The components shown as units may or may not be physical units. In other words, the components may be located in one place, or may be distributed to a plurality of network units. According to certain requirements, some or all of the units may be selected for realizing purposes of the embodiments of the present disclosure.

Additionally, functional units in each embodiment of the present disclosure may be integrated into one processing unit, or each of the units may exist separately and physically, or two or more units may be integrated into one unit. The integrated units above may be implemented in the form of hardware or in the form of software program modules.

If the integrated units are implemented in the form of software program modules and sold or used as an independent product, the integrated units may be stored in a computer-readable memory. Based on such understanding, if technical solutions of the present disclosure may be embodied in the form of a software product, the software product may be stored in a memory including several instructions to be used to enable a computer device (which may be a personal computer, a server, or a network device, and the like.) to perform all or part of steps of the method of the embodiments of the present disclosure. The foregoing memory may include: a USB flash drive, a read-only memory (ROM), a random access memory (RAM), a mobile hard disk, a magnetic disk, or an optical disc, and other media that may store program codes.

It should be understood that terms such as "first", "second", "third", and "fourth" appear in the claims, the specification, and the drawings are used for distinguishing different objects rather than describing a specific order. It should be understood that terms "including" and "comprising" used in the specification and the claims indicate the presence of a feature, an entity, a step, an operation, an element, and/or a component, but do not exclude the existence or addition of one or more other features, entities, steps, operations, elements, components, and/or collections thereof.

It should also be understood that terms used in the specification of the present disclosure are merely intended to describe specific embodiments rather than to limit the present disclosure. As being used in the specification and the claims of the disclosure, unless the context clearly indicates otherwise, singular forms such as "a", "an", and "the" are intended to include plural forms. It should also be understood that a term "and/or" used in the specification and the claims refers to any and all possible combinations of one or more of relevant listed items and includes these combinations.

As being used in this specification and the claims, a term "if" may be interpreted as "when", or "once" or "in response to a determination" or "in response to a case where something is detected" depending on the context. Similarly, depending on the context, a clause "if it is determined that" or "if [a described condition or event] is detected" may be interpreted as "once it is determined that", or "in response to a determination", or "once [a described condition or event] is detected", or "in response to a case where [a described condition or event] is detected".

The embodiments of the present disclosure have been described in detail above. Specific examples have been used in the specification to explain the principles and implementations of the present disclosure. The descriptions of the above embodiments are only used to facilitate understanding of the method and core ideas of the present disclosure. Persons of ordinary skill in the art may change or transform the specific implementations and application scope according to the ideas of the present disclosure. The changes and transformations shall all fall within the protection scope of the present disclosure. In summary, the content of this specification should not be construed as a limitation on the present disclosure.

What is claimed:

1. A computing apparatus for performing a neural network operation, the computing apparatus comprising:

an input terminal configured to receive at least one piece of weight data and at least one piece of neuron data of a to-be-performed neural network operation, wherein the input terminal includes at least two input ports that support a plurality of data bit widths;

a multiplication circuit including at least one floating-point multiplier, wherein the at least one floating-point multiplier is configured to perform a multiplication operation of the neural network operation on the at least one piece of weight data and the at least one piece of neuron data to obtain corresponding product results;

an addition circuit configured to perform an addition operation on the product results to obtain a plurality of intermediate results;

an update circuit configured to perform multiple summation operations on the plurality of intermediate results that are generated to output a final result of the neural network operation, wherein the update circuit includes a second adder and a register comprising a plurality of sub-registers, and the second adder is configured to perform following operations repeatedly until summation operations on all the plurality of intermediate results are completed:

receiving an intermediate result of the plurality of intermediate results from the addition circuit and a previous summation result from the register and a previous summation operation;

summing the intermediate result o and the previous summation result to obtain a summation result of a present summation operation; and by using the summation result of the present summation operation, updating the previous summation result that is stored in the register; and n sub-registers, wherein a number of times of reusing the neuron data is m, a maximum number of times of reusing the weight data is floor (n/m), m is equal to or less than n, a floor function represents performing a round-down operation on n/m, and the computing apparatus is configured to respectively divide and reuse the at least one piece of neuron data and the at least one piece of weight data to perform the neural network operation according to the plurality of data bit widths of the input ports.

2. The computing apparatus of claim 1, wherein the at least one piece of weight data and the at least one piece of neuron data are data with the same or different data types.

3. The computing apparatus of claim 1, further comprising:

a first type transformation circuit configured to perform data type transformations on the product results to enable the addition circuit to perform the addition operation.

4. The computing apparatus of claim 3, wherein the addition circuit includes a multi-level adder group arranged in a multi-level tree structure, and wherein each level of the multi-level adder group includes one or more first adders.

5. The computing apparatus of claim 4, further comprising: one or more second type transformation circuits placed on the multi-level adder group, which are configured to transform data output by one level of the multi-level adder group into another type of data for an addition operation of a next level of the multi-level adder group.

6. The computing apparatus of claim 1, wherein after outputting a product result of the product results, the multiplication circuit is further configured to receive a next pair of the at least one piece of weight data and the at least one piece of neuron data for the multiplication operation, and after outputting the intermediate result, the addition circuit is further configured to receive a next product result from the multiplication circuit for the addition operation.

7. The computing apparatus of claim 1, wherein the at least one floating-point multiplier, the addition circuit, and the update circuit are configured to perform a plurality of rounds of operations according to the division and the reuse of the at least one piece of weight data and the at least one piece of neuron data, wherein in each round of operation of the plurality of rounds of the operations, the obtained intermediate result of the plurality of intermediate results is stored in a corresponding sub-register of the plurality of sub-registers, and the update circuit is further configured to perform an update a sub-register of the plurality of sub-registers; and in a final round of operation of the plurality of rounds of the operations, the plurality of sub-registers is configured to output a final result of the neural network operation.

8. The computing apparatus of claim 7, wherein a number of result items of the final result is based on a number of times of reusing the at least one piece of neuron data and a number of times of reusing the at least one piece of weight data.

9. The computing apparatus of claim 7, wherein a maximum value of a number of times of reusing is based on a number of the plurality of sub-registers.

10. The computing apparatus of claim 1, wherein the at least one floating-point multiplier is used to perform a multiplication computation on the at least one piece of neuron data and the at least one piece of weight data according to a computation mode, wherein the at least one piece of neuron data and the at least one piece of weight data include at least respective exponents and respective mantissas, and the at least one floating-point multiplier includes:

an exponent processing circuit configured to obtain an exponent after the multiplication computation according to the computation mode, an exponent of the at least one piece of neuron data, and an exponent of the at least one piece of weight data; and a mantissa processing circuit configured to obtain a mantissa after the multiplication computation according to the computation mode, the at least one piece of neuron data, and the at least one piece of weight data, wherein the computation mode is used to indicate a data format of the at least one piece of neuron data and a data format of the at least one piece of weight data, wherein a data format includes at least one of a half precision floating-point number, a single precision floating-point number, a brain floating-point number, a double precision floating-point number, and a self definition floating-point number.

11. The computing apparatus of claim 10, wherein the computation mode is further used to indicate a data format after the multiplication computation.

12. The computing apparatus of claim 10, wherein the at least one piece of neuron data and the at least one piece of weight data further include respective signs, and the at least one floating-point multiplier further includes:

a sign processing circuit configured to obtain a sign after the multiplication computation according to a sign of the at least one piece of neuron data and a sign of the at least one piece of weight data, wherein the sign processing circuit includes an exclusive OR logic circuit, wherein the exclusive OR logic circuit is configured to perform an exclusive OR computation according to a sign of the at least one piece of neuron data and a sign of the at least one piece of weight data to obtain a sign after the multiplication computation.

13. The computing apparatus of claim 10, further comprising:

a normalization processing circuit configured to perform normalization processing on the at least one piece of neuron data or the at least one piece of weight data according to the computation mode when the at least one piece of neuron data or the at least one piece of weight data is a non-normalized and non-zero floating-point number, so as to obtain a corresponding exponent and a corresponding mantissa.

14. The computing apparatus of claim 10, wherein the mantissa processing circuit includes a partial product computation circuit and a partial product summation circuit, wherein the partial product computation circuit is configured to obtain mantissa intermediate results according to a mantissa of the at least one piece of neuron data and a mantissa of the at least one piece of weight data, and the partial product summation circuit is configured to perform a summation computation on the mantissa intermediate results to obtain a summation result and take the summation result as the mantissa after the multiplication computation.

15. The computing apparatus of claim 10, wherein the at least one floating-point multiplier further includes:

a mode selection circuit configured to select the computation mode that indicates the data format of the at least one piece of neuron data and the data format of the at least one piece of weight data from a plurality of types of computation modes that are supported by the at least one floating-point multiplier.

16. A method for performing a neural network operation by a computing apparatus, the method comprising:

receiving, by an input terminal, at least one piece of weight data and at least one piece of neuron data of a to-be-performed neural network operation, wherein the input terminal includes at least two input ports that support a plurality of data bit widths;

performing, by a multiplication circuit including at least one floating-point multiplier, a multiplication operation of the neural network operation on the at least one piece of weight data and the at least one piece of neuron data to obtain corresponding product results;

performing, by an addition circuit, an addition operation on the product results to obtain a plurality of intermediate results; and performing, by an update circuit, multiple summation operations on the plurality of intermediate results that are generated, so as to output a final result of the neural network operation, wherein the update circuit includes a second adder and a register comprising a plurality of sub-registers, the second adder is configured to perform following operations repeatedly until summation operations on all the plurality of intermediate results are completed:

receiving an intermediate result of the plurality of intermediate results from the addition circuit and a previous summation result from the register and a previous summation operation;

summing the intermediate result and the previous summation result to obtain a summation result of a present summation operation; and by using the summation result of the present summation operation, updating a previous summation result that is stored in the register; and the computing apparatus includes n sub-registers, a number of times of reusing the neuron data is m, a maximum number of times of reusing the weight data is floor (n/m), m is equal to or less than n, a floor function represents performing a round-down operation on n/m, and the computing apparatus is configured to respectively divide and reuse the at least one piece of neuron data and the at least one piece of weight data to perform the neural network operation according to the plurality of data bit widths of the input ports.

17. A computing apparatus for performing a neural network operation, the computing apparatus comprising:

an input terminal configured to receive at least one piece of weight data and at least one piece of neuron data of a to-be-performed neural network operation, wherein the input terminal includes at least two input ports that support a plurality of data bit widths;

a multiplication circuit including at least one floating-point multiplier, wherein the at least one floating-point multiplier is configured to perform a multiplication operation of the neural network operation on the at least one piece of weight data and the at least one piece of neuron data to obtain corresponding product results;

an addition circuit configured to perform an addition operation on the product results to obtain a plurality of intermediate results; and an update circuit configured to perform multiple summation operations on the plurality of intermediate results that are generated to output a final result of the neural network operation, wherein the update circuit includes a second adder and a register comprising a plurality of registers, the second adder is configured to perform following operations repeatedly until summation operations on all the plurality of intermediate results are completed:

receiving an intermediate result of the plurality of intermediate results from the addition circuit and a previous summation result from the register and a previous summation operation;

summing the intermediate result and the previous summation result to obtain a summation result of a present summation operation; and by using the summation result of the present summation operation, updating the previous summation result that is stored in the register;

the at least one floating-point multiplier, the addition circuit, and the update circuit are configured to perform a plurality of rounds of operations according to a division and a reuse of the at least one piece of weight data and the at least one piece of neuron data, in each round of operation, an obtained intermediate result is stored in a corresponding sub-register of the plurality of sub-registers, an update of a sub-register of the plurality of sub-registers is performed by the update circuit, in a final round of operation, the final result of the neural network operation is output by the plurality of sub-registers, wherein a maximum value of a number of times of reusing of the at least one piece of weight data and the at least one piece of neuron data, is based on a number of the plurality of sub-registers, and the computing apparatus is configured to respectively divide and reuse the at least one piece of neuron data and the at least one piece of weight data to perform the neural network operation according to the plurality of data bit widths of the input ports.

* * * * *